(12) United States Patent
Fung

(10) Patent No.: US 10,090,157 B2
(45) Date of Patent: Oct. 2, 2018

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventor: Ka-Hing Fung, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/599,656

(22) Filed: May 19, 2017

(65) Prior Publication Data

US 2017/0358646 A1 Dec. 14, 2017

Related U.S. Application Data

(62) Division of application No. 15/179,008, filed on Jun. 10, 2016, now Pat. No. 9,691,851.

(51) Int. Cl.
*H01L 21/00* (2006.01)
*H01L 21/306* (2006.01)
(Continued)

(52) U.S. Cl.
CPC ........ *H01L 21/30604* (2013.01); *B82Y 10/00* (2013.01); *H01L 21/31111* (2013.01);
(Continued)

(58) Field of Classification Search
CPC ........... H01L 29/0676; H01L 21/30604; H01L 21/31111; H01L 27/0924; H01L 29/0649;
(Continued)

(56) References Cited

U.S. PATENT DOCUMENTS 8,735,869 B2   5/2014  Cappellani et al.
9,209,247 B2  12/2015  Colinge et al.
(Continued)

OTHER PUBLICATIONS

Notice of Allowance U.S. Appl. No. 15/179,008 dated Feb. 21, 2017.

*Primary Examiner* — Nicholas Tobergte
(74) *Attorney, Agent, or Firm* — McDermott Will & Emery LLP

(57) ABSTRACT

A semiconductor device includes one nanowire structure disposed on semiconductor substrate and extending in first direction on semiconductor substrate. Each nanowire structure includes plurality of nanowires extending along first direction and arranged in second direction, the second direction being substantially perpendicular to first direction. Each nanowire is spaced-apart from immediately adjacent nanowire. A gate structure extends in third direction over first region of nanowire structure, the third direction being substantially perpendicular to both first direction and second direction. The gate structure includes a gate electrode. Source/drain regions are disposed over second region of nanowire structure, the second region being located on opposing sides of gate structure. The gate electrode wraps around each nanowire. When viewed in cross section taken along third direction, each nanowire in nanowire structure is differently shaped from other nanowires, and each nanowire has substantially same cross-sectional area as other nanowires in nanowire structure.

20 Claims, 23 Drawing Sheets

(51) Int. Cl.

| | |
|---|---|
| *H01L 29/06* | (2006.01) |
| *H01L 29/78* | (2006.01) |
| *H01L 29/66* | (2006.01) |
| *H01L 27/092* | (2006.01) |
| *H01L 21/311* | (2006.01) |
| *B82Y 10/00* | (2011.01) |
| *H01L 29/423* | (2006.01) |
| *H01L 29/775* | (2006.01) |
| *H01L 21/8238* | (2006.01) |

(52) U.S. Cl.
CPC ...... *H01L 27/0924* (2013.01); *H01L 29/0649* (2013.01); *H01L 29/0673* (2013.01); *H01L 29/0684* (2013.01); *H01L 29/42392* (2013.01); *H01L 29/66439* (2013.01); *H01L 29/66545* (2013.01); *H01L 29/66795* (2013.01); *H01L 29/775* (2013.01); *H01L 29/785* (2013.01); *H01L 21/823807* (2013.01); *H01L 21/823814* (2013.01); *H01L 21/823821* (2013.01); *H01L 29/66469* (2013.01); *H01L 2029/7858* (2013.01)

(58) Field of Classification Search
CPC ............... H01L 29/0684; H01L 29/161; H01L 29/42356; H01L 29/66545; H01L 29/66795; H01L 29/785
See application file for complete search history.

(56) References Cited

U.S. PATENT DOCUMENTS

| | | | |
|---|---|---|---|
| 9,224,833 B2 | 12/2015 | Chen et al. | |
| 9,230,989 B2* | 1/2016 | Chang | B82Y 10/00 |
| 9,251,888 B1 | 2/2016 | Liaw | |
| 9,281,363 B2* | 3/2016 | Chen | H01L 29/0676 |
| 9,443,856 B2* | 9/2016 | Ching | H01L 27/092 |
| 2010/0207208 A1* | 8/2010 | Bedell | B82Y 10/00 |
| | | | 257/346 |
| 2014/0151757 A1* | 6/2014 | Basu | B82Y 40/00 |
| | | | 257/288 |
| 2015/0048442 A1 | 2/2015 | Colinge et al. | |
| 2015/0303270 A1 | 10/2015 | Liaw | |
| 2016/0211322 A1* | 7/2016 | Kim | H01L 29/66795 |

\* cited by examiner

SEMICONDUCTOR DEVICE AND MANUFACTURING METHOD THEREOF

CROSS-REFERENCE TO RELATED APPLICATIONS

This application is a Divisional Application of U.S. Ser. No. 15/179,008 filed Jun. 10, 2016, now U.S. Pat. No. 9,691,851, the subject matter of which is incorporated herein by reference in entirety.

TECHNICAL FIELD

The disclosure relates to a semiconductor integrated circuit, and more particularly to a semiconductor device having a gate-all-around structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET) including a fin FET (FinFET) and a gate-all-around (GAA) FET. In a FinFET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and result in less short-channel effects due to steeper sub-threshold current swing (SS) and smaller drain induced barrier lowering (DIBL).

As transistor dimensions are continually scaled down to sub 20-25 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1:
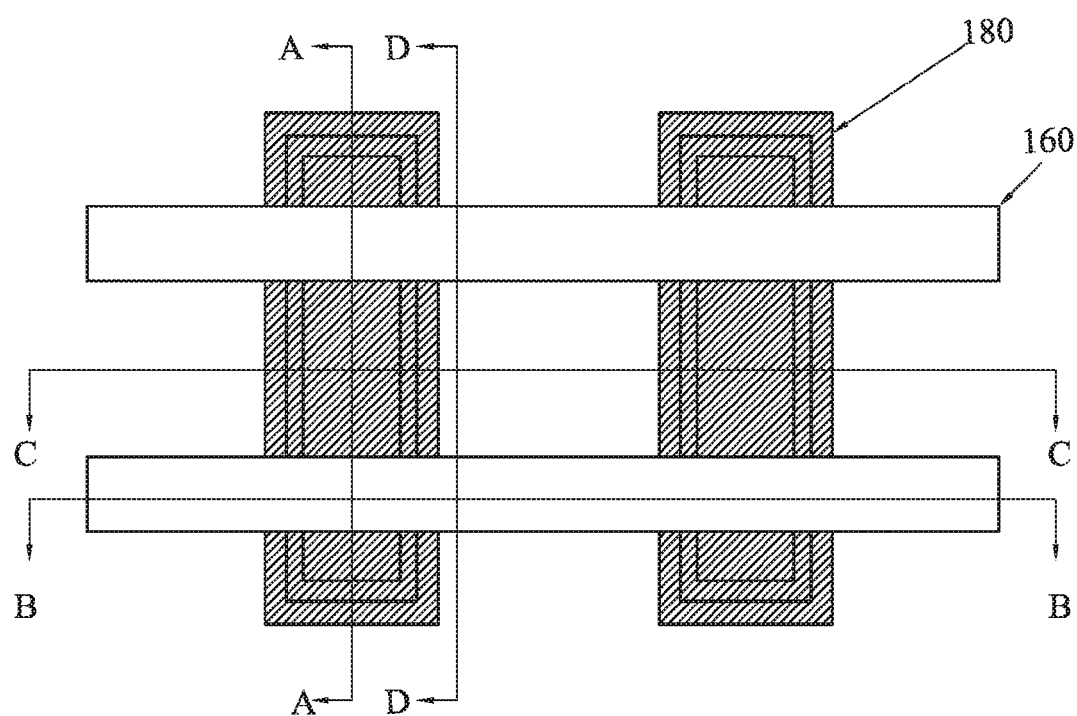
FIG. 1 is a plan view of an embodiment of a GAA FET device according to the present disclosure.
Figure 1:
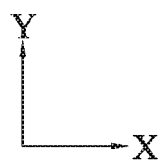

FIG. 1 is a plan view of an embodiment of a GAA FET device according to the present disclosure.

FIGS. 2-17 show exemplary sequential processes for manufacturing GAA FET device according to embodiments of the present disclosure. It is understood that additional operations can be provided before, during, and after processes shown by FIGS. 2-17, and some of the operations described below can be replaced or eliminated, for certain embodiments of the method. The order of the operations/processes may be interchangeable.

A plan view of a GAA FET device is illustrated in FIG. 1. As shown in FIG. 1, gate electrode structures 160 are formed overlying nanowire structures 180. Although two fin structures and two gate structures are shown in FIG. 1, GAA FET devices according to the present disclosure may include one or three or more fin structures and one or three or more gate electrode structures.

Figure 2:
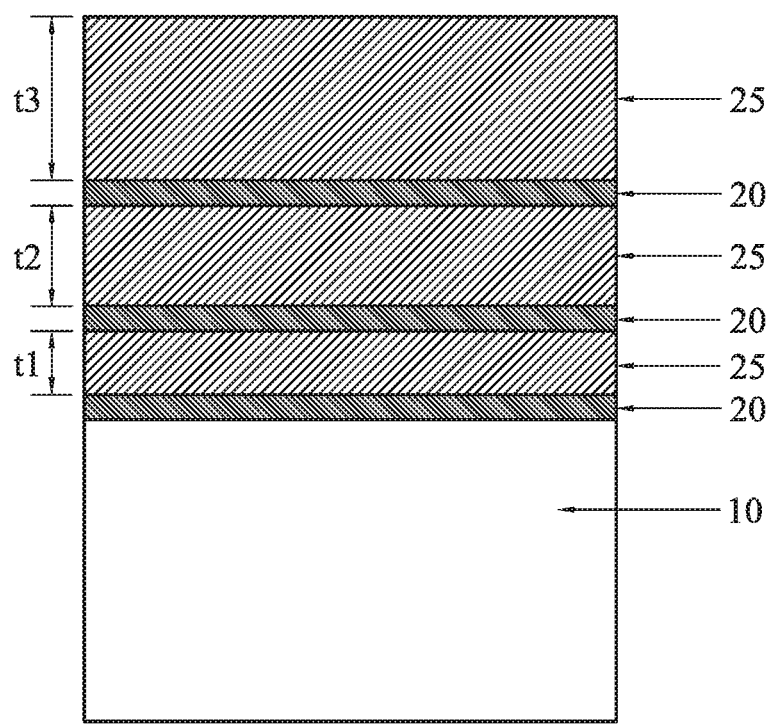
FIGS. 2-17 show exemplary sequential processes for manufacturing a GAA FET device according to embodiments of the present disclosure.
Figure 2:
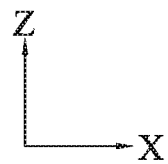

As shown in FIG. 2, stacked semiconductor layers are formed over a substrate 10. The stacked semiconductor layers include first semiconductor layers 20 and second semiconductor layers 25. FIG. 2 is a cross-section view taken along line A-A of FIG. 1.

In one embodiment, substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb, and InP. In a certain embodiment, the substrate 10 is made of Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

The first semiconductor layers 20 and the second semiconductor layers 25 are made of materials having different lattice constants, and may include one or more layers of such as, but not limited to, Si, Ge, SiGe, GaAs, InSb, GaP, GaSb, InAlAs, InGaAs, GaSbP, GaAsSb, and InP.

In some embodiments, the first semiconductor layers 20 and the second semiconductor layers 25 are made of Si, a Si compound, SiGe, Ge, or a Ge compound. In one embodiment, the first semiconductor layers 20 are Si or $Si_{1-y}Ge_y$, where y is less than about 0.4, and the second semiconductor layers 25 are $Si_{1-x}Ge_x$, where x is more than about 0.3, or Ge (x=1.0), and x>y. In this disclosure, an "M" compound" or an "M based compound" means the majority of the compound is M.

In another embodiment, the second semiconductor layers 25 are Si or where x is less than about 0.4, or Ge, and the first semiconductor layers 20 are $Si_{1-y}Ge_y$, where y is more than about 0.4, and x<y.

In yet other embodiments, the second semiconductor layer 25 is made of where x is in a range from about 0.3 to about 0.8, and the first semiconductor layer 20 is made of $Si_{1-y}Ge_y$, where y is in a range from about 0.1 to about 0.4, and x>y.

In FIG. 2, three layers of the first semiconductor layer 20 and three layers of the second semiconductor layer 25 are disposed. However, the number of the layers are not limited to three, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of each of the first semiconductor layers 20 may be equal to each other, and are in a range from about 5 nm to about 50 nm in some embodiments, and are in a range from about 10 nm to about 30 nm in other embodiments. In some embodiments, the bottom first semiconductor layer 20 (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

The thicknesses of the second semiconductor layers 25 are in a range from about 5 nm to about 100 nm in some embodiments, and is in a range from about 10 nm to about 50 nm in other embodiments. The thickness of each of the second semiconductor layers 25 increases as the distance from the substrate 10 increases. For example, a bottom second semiconductor layer 25 has a thickness t1. The thickness t2 of an adjacent middle second semiconductor layer 25 is greater than the thickness t1 of the bottom second semiconductor layer, and the thickness t3 of a top second semiconductor layer is greater than the thickness t2 of the middle second semiconductor layer.

Figure 3:
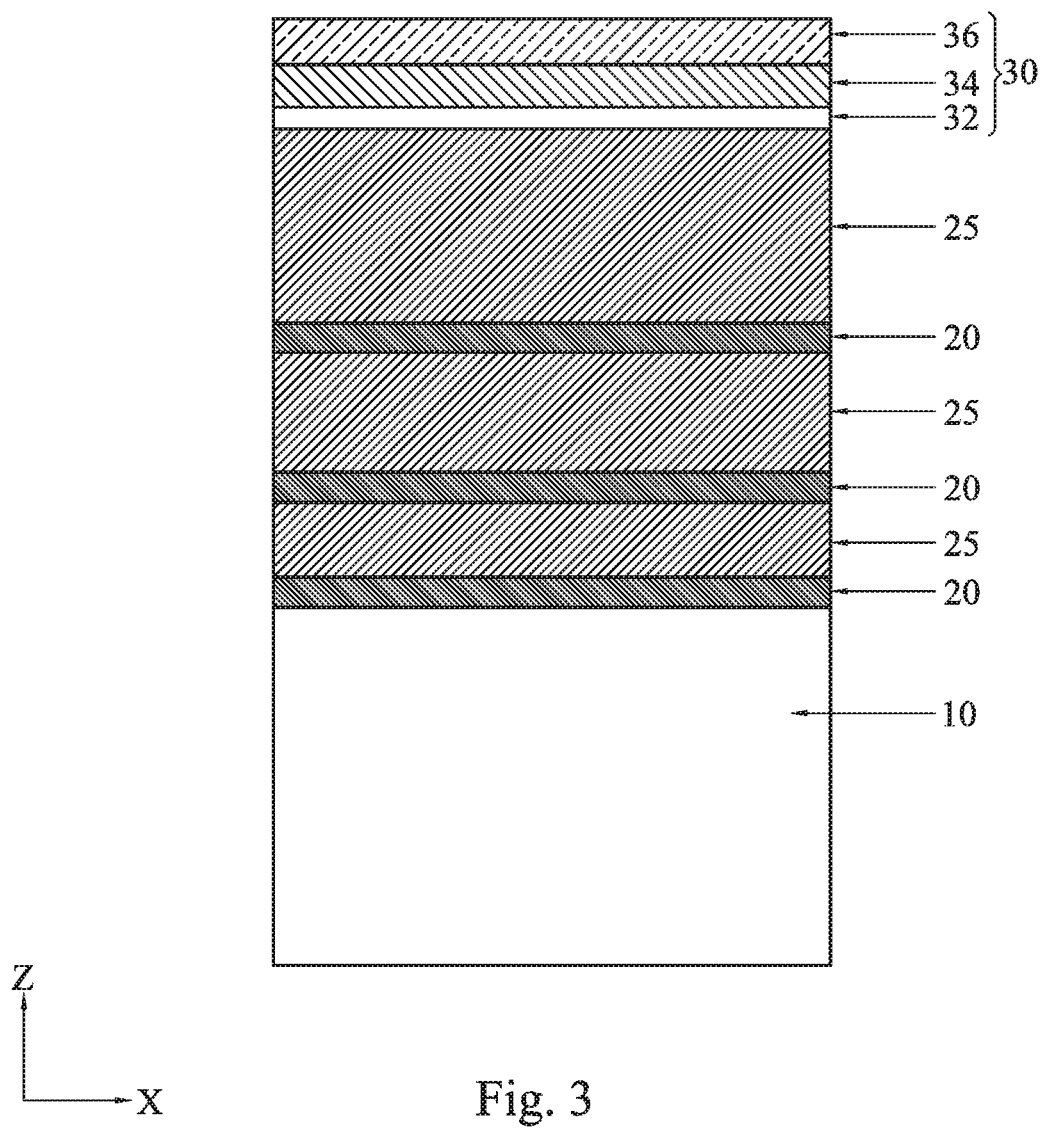
Figure 4:
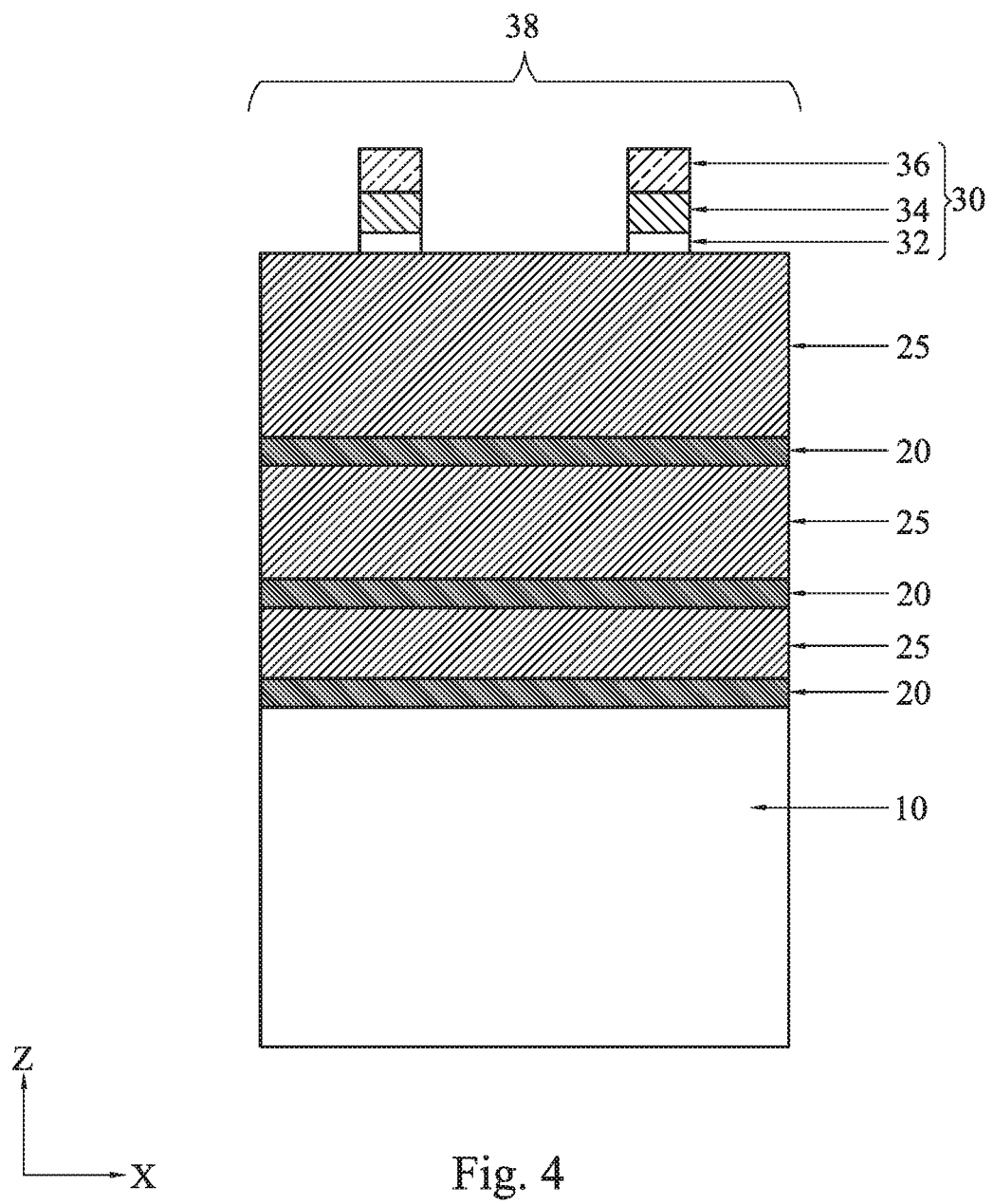

Next, as shown in FIG. 3 a mask layer 30 is formed over the stacked layers. In some embodiments, the mask layer 30 includes a first mask layer 32, a second mask layer 34 and a third mask layer 36. The first mask layer 32 is a pad oxide layer made of a silicon oxide, which can be formed by a thermal oxidation. The second mask layer 34 is made of a silicon nitride (SiN) and the third mask layer 36 is made of a silicon oxide, both of which are formed by chemical vapor deposition (CVD), including low pressure CVD (LPCVD) and plasma enhanced CVD (PECVD), physical vapor deposition (PVD), atomic layer deposition (ALD), or other suitable processes. The mask layer 30 is patterned into a mask pattern 38 by using patterning operations including photolithography and etching, as shown in FIG. 4.

Figure 5:
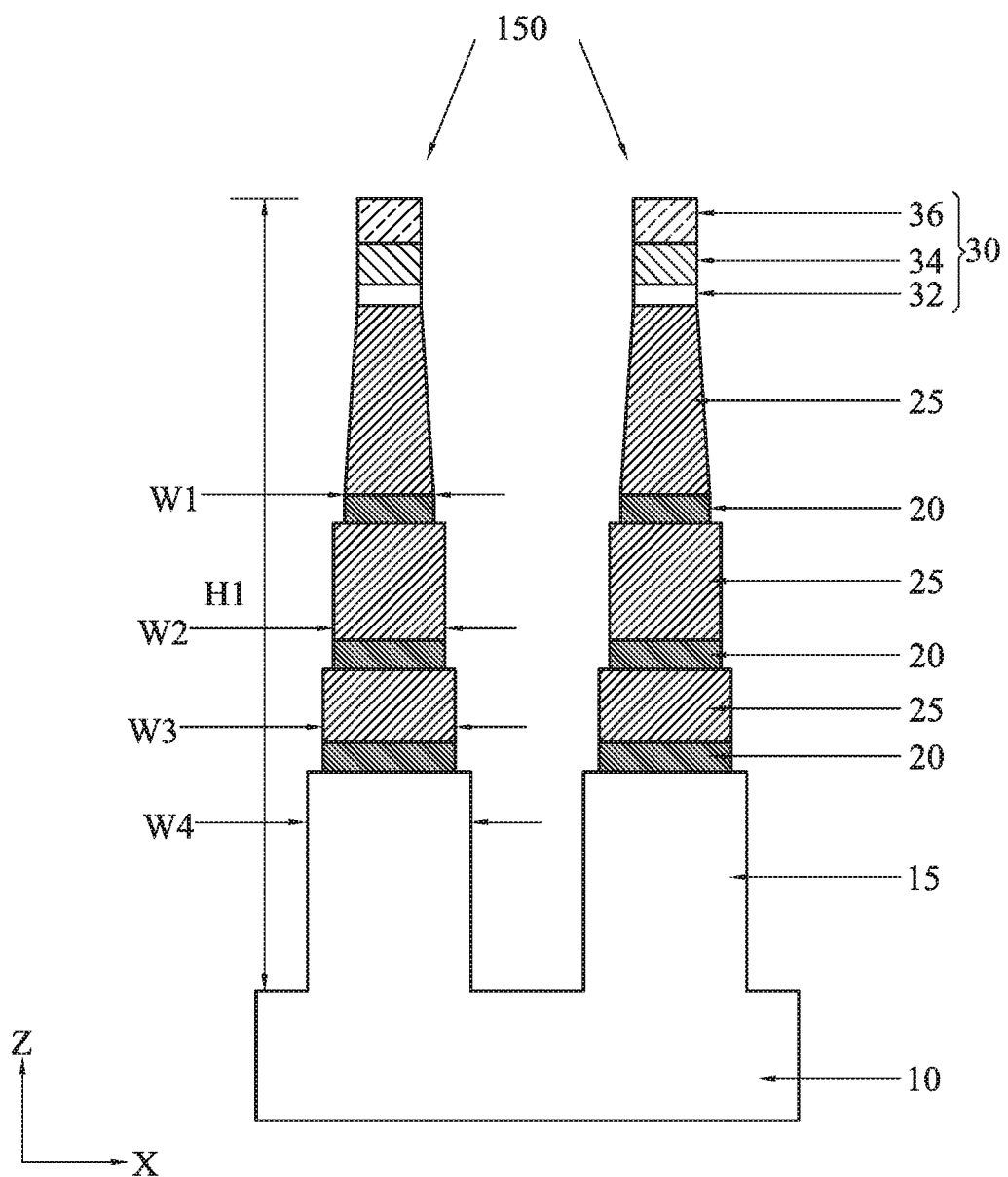

Next, as shown in FIG. 5, which is a cross-sectional view corresponding to line B-B of FIG. 1, the stacked layers of the first and second semiconductor layers 20, 25 are patterned by using the mask pattern 30. By appropriate selection of etching technique, the second semiconductor layers 25 are patterned so the width of each second semiconductor layer 25 decreases in the X direction for each second semiconductor layer 25 as the distance from the substrate 10 increases. For example, as shown in FIG. 5, the width W3 of the bottom second semiconductor layer 25 closest to the substrate 10 is greater than the width W2 of the adjacent middle second semiconductor layer 25. The width of the middle second semiconductor layer W2 is greater than the width W1 of the top second semiconductor layer 25 furthest from the substrate 10. The width of the second semiconductor layers along the X direction is in a range from about 4 nm to about 12 nm in some embodiments. If the width of the semiconductor layer 25 is less than about 4 nm the wire will be to small and may break. If the width of the semiconductor layer 25 is more than about 12 nm it will take up too much space. Each of the fin structures 150 includes a bottom layer 15, which is a part of the etched substrate. The width W4 of the bottom layer 15 is greater than the width of W3 of the second semiconductor layer 25 closest to the substrate 10. In certain embodiments, the width W4 of the bottom layer 15 is about 12 nm and the width W1 of the top semiconductor layer 25 is about 4 nm. In other embodiments, the width W4 of the bottom layer 15 is about 10 nm and the width W1 of the top semiconductor layer 25 is about 6 nm. The height H1 along the Z direction of the fin structure 150 is in a range from about 30 nm to about 100 nm.

In certain embodiments, the uppermost second semiconductor layer 25 from the substrate is substantially trapezoidal-shaped when viewed in cross section, as shown in FIG. 5, and the lower second semiconductor layers 25 are substantially rectangular-shaped. The different shaped second semiconductor layers 25 may be formed by a series of photolithographic and etching operations, and varying the photolithographic and etching parameters. For example, in certain embodiments, isotropic etching is performed on the uppermost second semiconductor layer and anisotropic etching is performed on the lower second semiconductor layers. In certain embodiments, each of the second semiconductor layers 25 have substantially the same cross-sectional area when viewed in cross section. Substantially the same cross-sectional area as used herein means the cross-sectional area of each of the second semiconductor layers 25 are within 10% of each other.

Figure 6:
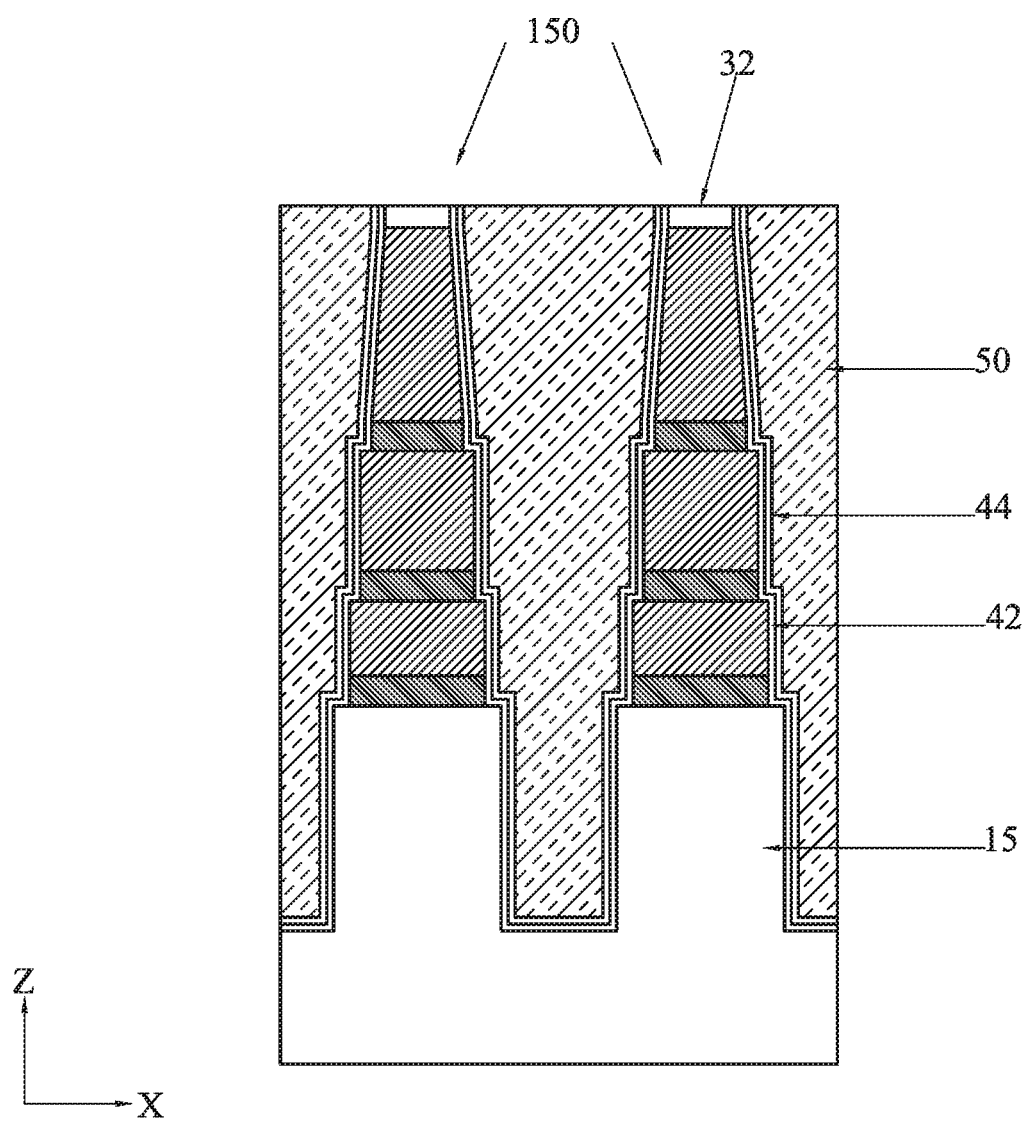

After the fin structure 150 is formed, an isolation insulating layer 50 including one or more layers of insulating material is formed over the substrate so that the fin structures 150 are fully embedded in the insulating layer 50. The insulating material for the insulating layer 50 may include silicon oxide, silicon nitride, silicon oxynitride (SiON), SiOCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer 50. Then, a planarization operation, such as a chemical mechanical polishing (CMP) method and/or an etch-back method, is performed such that the upper surface of the pad oxide layer 32 is exposed from the insulating material layer as shown in FIG. 6. In some embodiments, the upper surface of the fin structures 150 is exposed.

In some embodiments, a first liner layer 42 is formed over the structure of FIG. 5 and a second liner layer 44 is further formed over the first liner layer 42, as shown FIG. 6. The first liner layer 42 is made of silicon oxide or a silicon oxide-based material and the second liner layer 44 is made of SiN or a silicon nitride-based material. The liner layers 42, 44 protect the semiconductor layers 20, 25 from oxidation during subsequent operations, such as forming an interlayer dielectric or shallow trench isolation.

Figure 7:
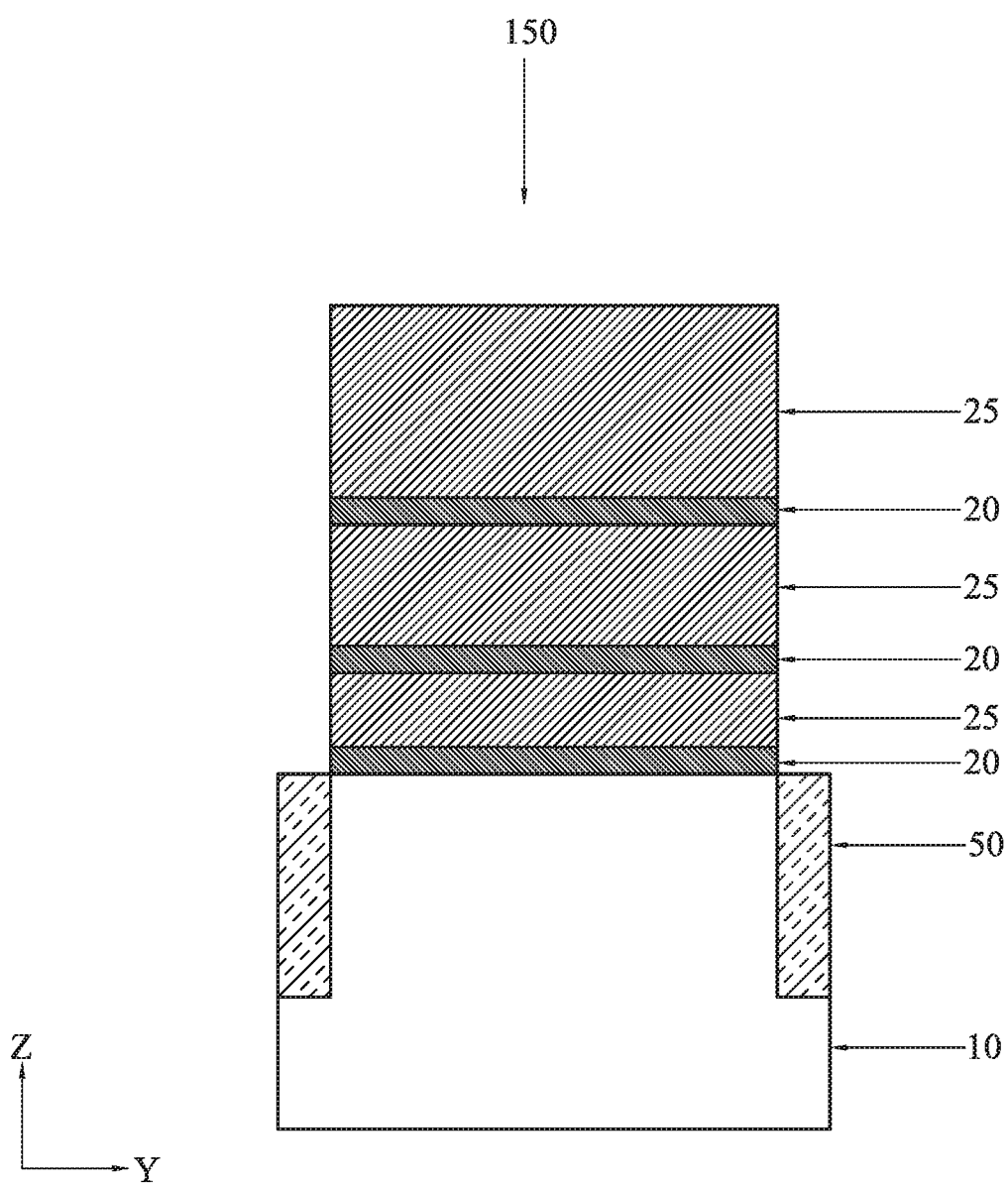

Then, as shown in FIG. 7, an etching operation is performed to recess the isolation insulating layer 50 to expose a part of the fin structures 150. FIG. 7 is a cross section view corresponding to line A-A of FIG. 1. In certain embodiments, as shown in FIG. 7, the bottom first semiconductor layer 20 is fully exposed from the isolation insulating layer. In other embodiments, the bottom first semiconductor layer is embedded in the isolation insulating layer 50, or is partially exposed from the isolation insulating layer 50.

Figure 8:
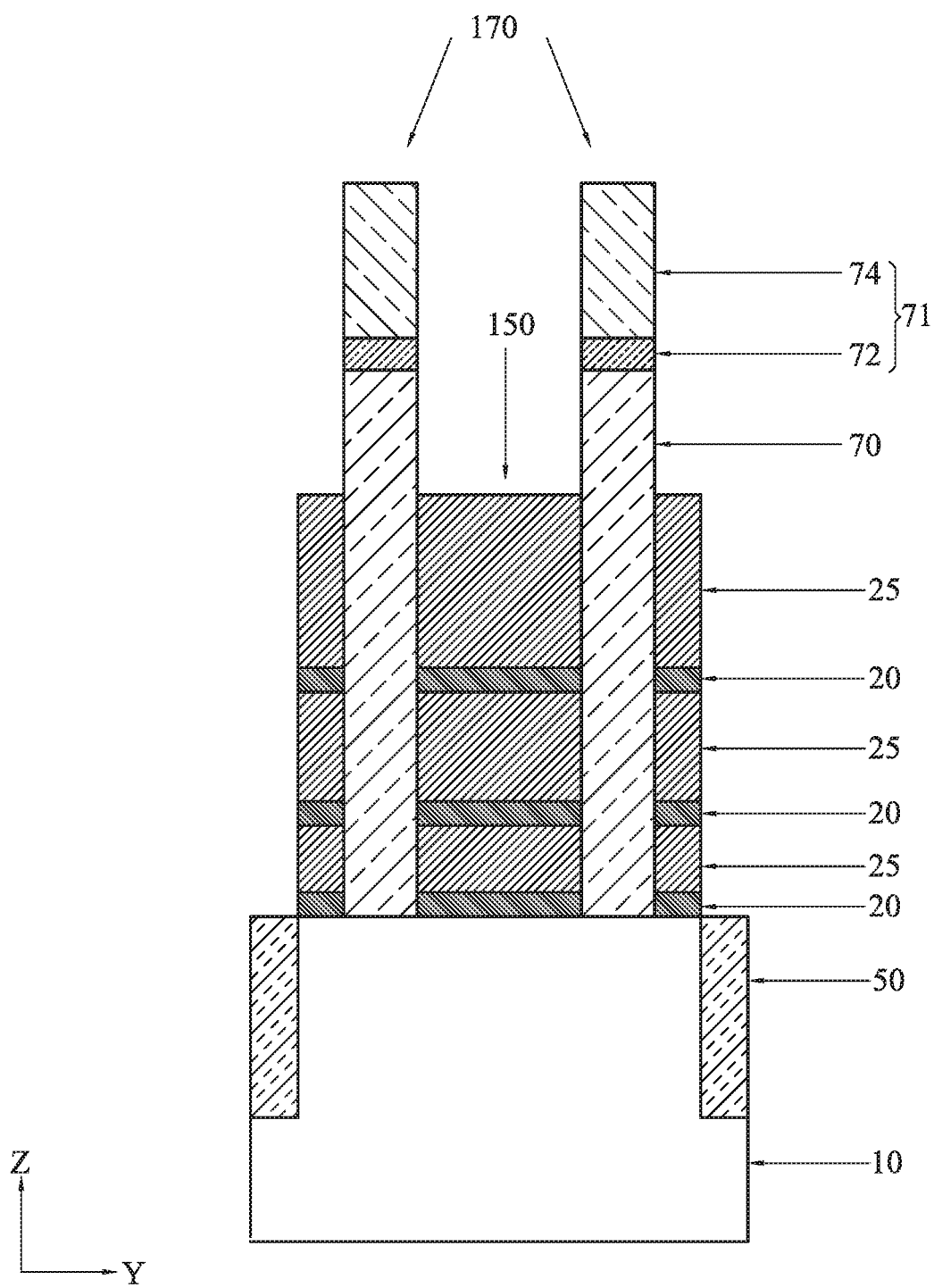

FIG. 8 illustrates a structure after sacrificial gate structures 170 are formed over the fin structure 150. The sacrificial gate structures 170 includes a sacrificial gate electrode 70 and a sacrificial gate dielectric layer (not shown). The sacrificial gate structure 170 is formed over a portion of the fin structure 150 which is to be a channel region. The sacrificial gate structure 170 defines the channel region of the GAA FET.

The sacrificial gate structure 170 is formed by first blanket depositing a sacrificial gate dielectric layer over the fin structure 150. The sacrificial gate dielectric layer includes one or more layers of silicon oxide, silicon nitride or silicon oxynitride. The thickness of the sacrificial gate dielectric layer is in a range from about 1 nm to about 5 nm in some embodiments. A sacrificial gate electrode layer is then blanket deposited on the sacrificial gate dielectric layer and over the fin structure 10, such that the fin structure 150 is fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process.

Subsequently, a mask layer 71 is formed over the sacrificial gate electrode layer. The mask layer 71 includes a pad SiN layer 72 and a silicon oxide mask layer 74.

Next, a patterning operation is performed on the mask layer 71 and sacrificial gate electrode layer is patterned into the sacrificial gate structures 170, as shown in FIG. 8. By patterning the sacrificial gate structures 170, the second semiconductor layers 25 are exposed on opposite sides of the sacrificial gate structure 170, as source/drain (S/D) regions. In this disclosure, a source and a drain are interchangeably used and the structures thereof are substantially the same.

Figure 9:
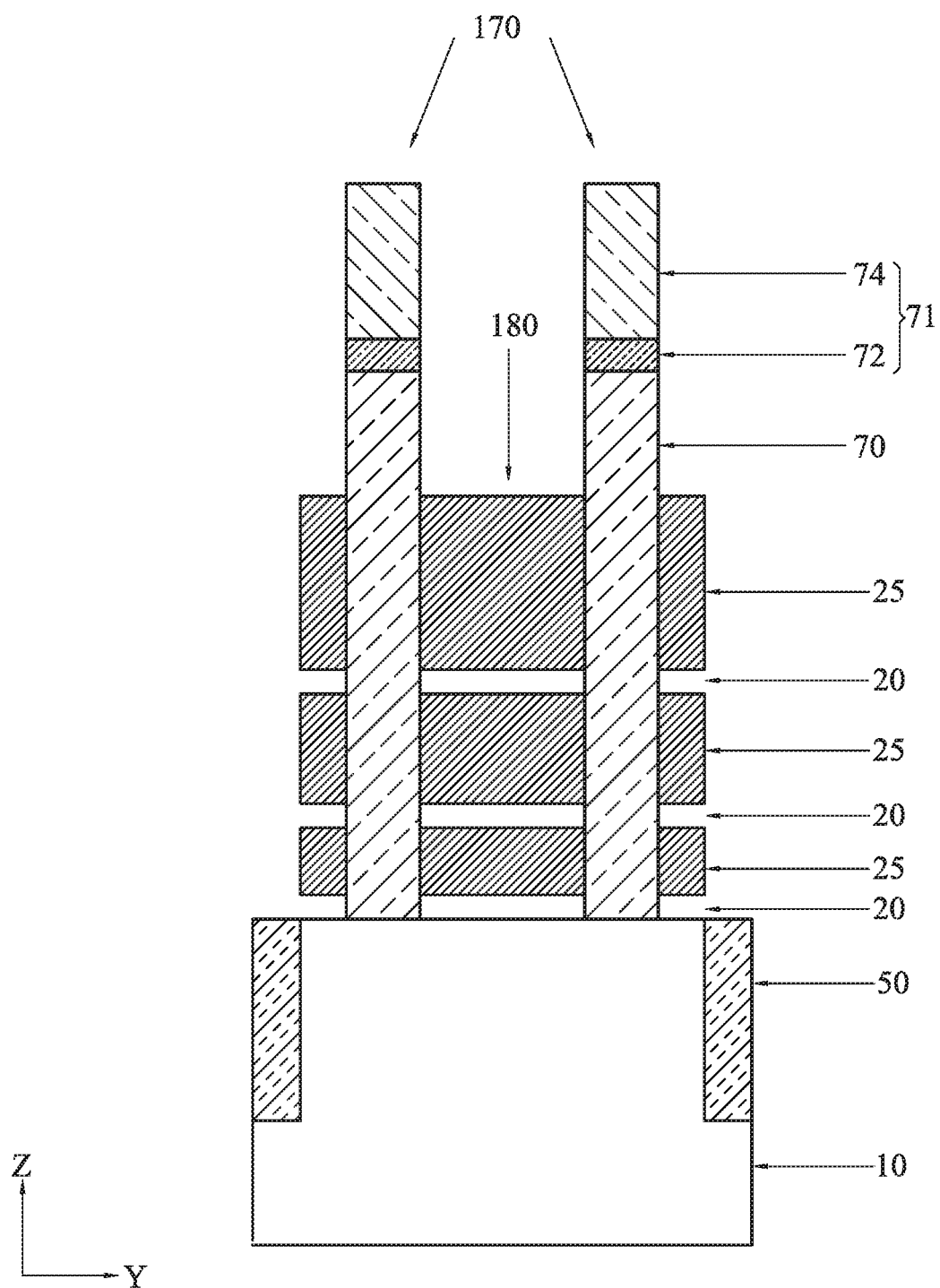

After forming the sacrificial gate structures 170, the first semiconductor layers 20 in the fin structure are removed, thereby forming a nanowire structure 180 including a plurality of stacked nanowires of the second semiconductor layers 25 arranged in the Z direction, as shown in FIG. 9. In certain embodiments, each of the stacked nanowires have substantially the same cross-sectional area when viewed in cross section.

The first semiconductor layers 20 can be removed or etched using an etchant that selectively etches the first semiconductor layers 20 against the second semiconductor layers 25.

When the first semiconductor layers 20 are Ge or SiGe and the second semiconductor layers 25 are Si, the first semiconductor layers 20 can be selectively removed using a wet etchant such as, but not limited to hydrogen peroxide ($H_2O_2$)/ammonium hydroxide ($NH_4OH$) solution, nitric acid ($HNO_3$)/acetic acid ($CH_3COOH$) solution, or hydrofluoric acid (HF)/hydrogen peroxide/acetic acid solution.

When the first semiconductor layers 20 are Si and the second semiconductor layers 25 are Ge or SiGe, the first semiconductor layers 20 can be selectively removed using a wet etchant such as, but not limited to tetramethylammonium hydroxide (TMAH) solution, ethylenediamine pyrocatechol (EDP) solution, or potassium hydroxide (KOH) solution.

In certain embodiments, one nanowire structure is part of a P-type FET and an adjacent nanowire structure is part of an N-type FET. The first semiconductor layer 20 is used to form nanowires in one type of FET and the second semiconductor layer 25 is used to form nanowires in the other type of FET. During processing, the first semiconductor layers of one fin structure are selectively etched to form one nanowire structure by using an appropriate etchant and the adjacent fin structure is covered by a protective layer, such as a photoresist layer or a dielectric layer. When the second semiconductor layers of the adjacent fin structure are selectively etched to form a second nanowire structure, the one nanowire structure is covered by a protective layer.

Figure 10:
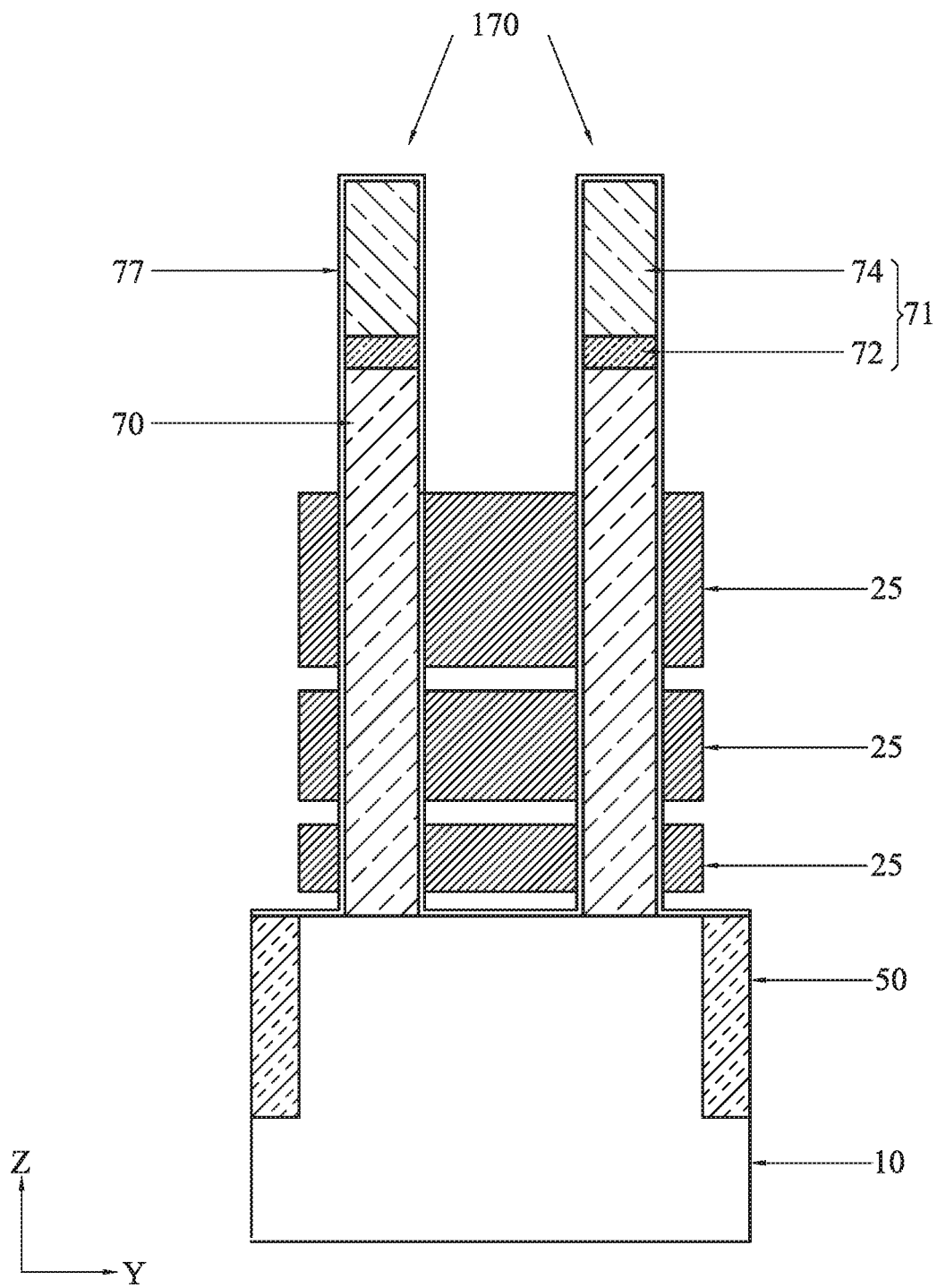

A blanket layer 77 of an insulating material for sidewall spacers is conformally formed by using CVD or other suitable methods, as shown in FIG. 10, in some embodiments. The blanket layer 77 is deposited in a conformal manner so that it is formed to have substantially equal thicknesses on vertical surfaces, such as the sidewalls, horizontal surfaces, and the top of the sacrificial gate structure. In some embodiments, the blanket layer 77 is deposited to a thickness in a range from about 2 nm to about 10 nm. In one embodiment, the insulating material of the blanket layer 77 is a silicon nitride-based material, such as SiN, SiON, SiOCN or SiCN and combinations thereof.

Figure 11:
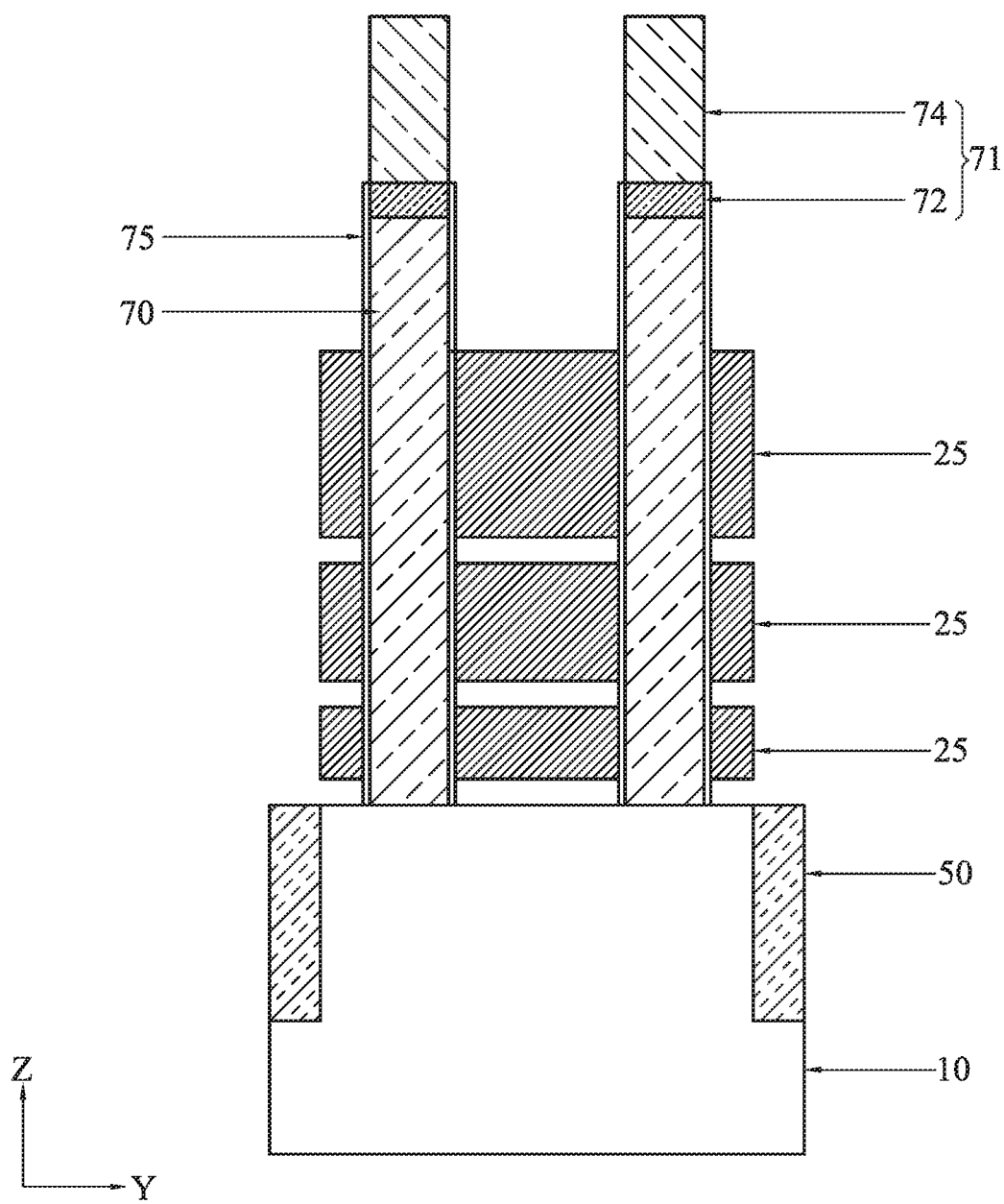

Further, as shown in FIG. 11, side wall spacers 75 are formed on opposite sidewalls of the sacrificial gate structures 170. After the blanket layer 77 is formed, anisotropic etching is performed on the blanket layer 77 using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed nanowire structures. The mask layer 74 may be exposed from the sidewall spacers 75.

Figure 12:
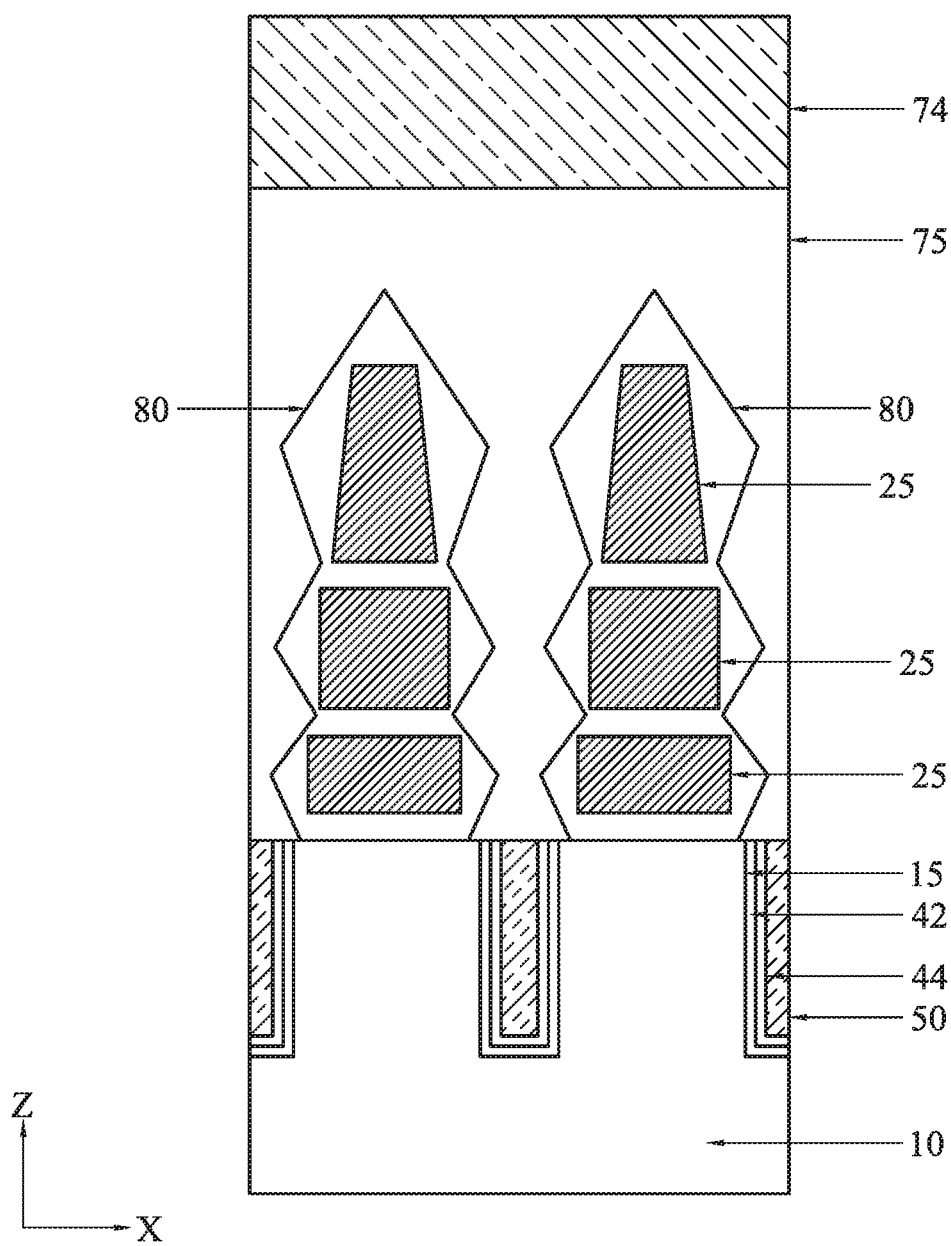

After at least the upper portions of the nanowire structures 180 are exposed from the sidewall spacers, source/drain (S/D) layers 80 are formed on and around the exposed portions of the nanowire structures 180, as shown in FIG. 12. FIG. 12 is a cross-sectional view corresponding to line C-C of FIG. 1.

The material for the S/D layer 80 includes one or more layers of Ge or SiGe, for P-type FETs, and one or more layers of Si, SiP, or SiC for N-type FETs.

The S/D layers 80 are formed by an epitaxial growth method using CVD, ALD, or molecular beam epitaxy (MBE). When the S/D layer 80 for a P-type FET is formed, the nanowire structure 180 of N-type FETs is covered by a protective layer, such as SiN, and when the S/D layer 80 for an N-type FET is formed, the nanowire structure 180 of P-type FETs are covered by a protective layer.

Figure 13:
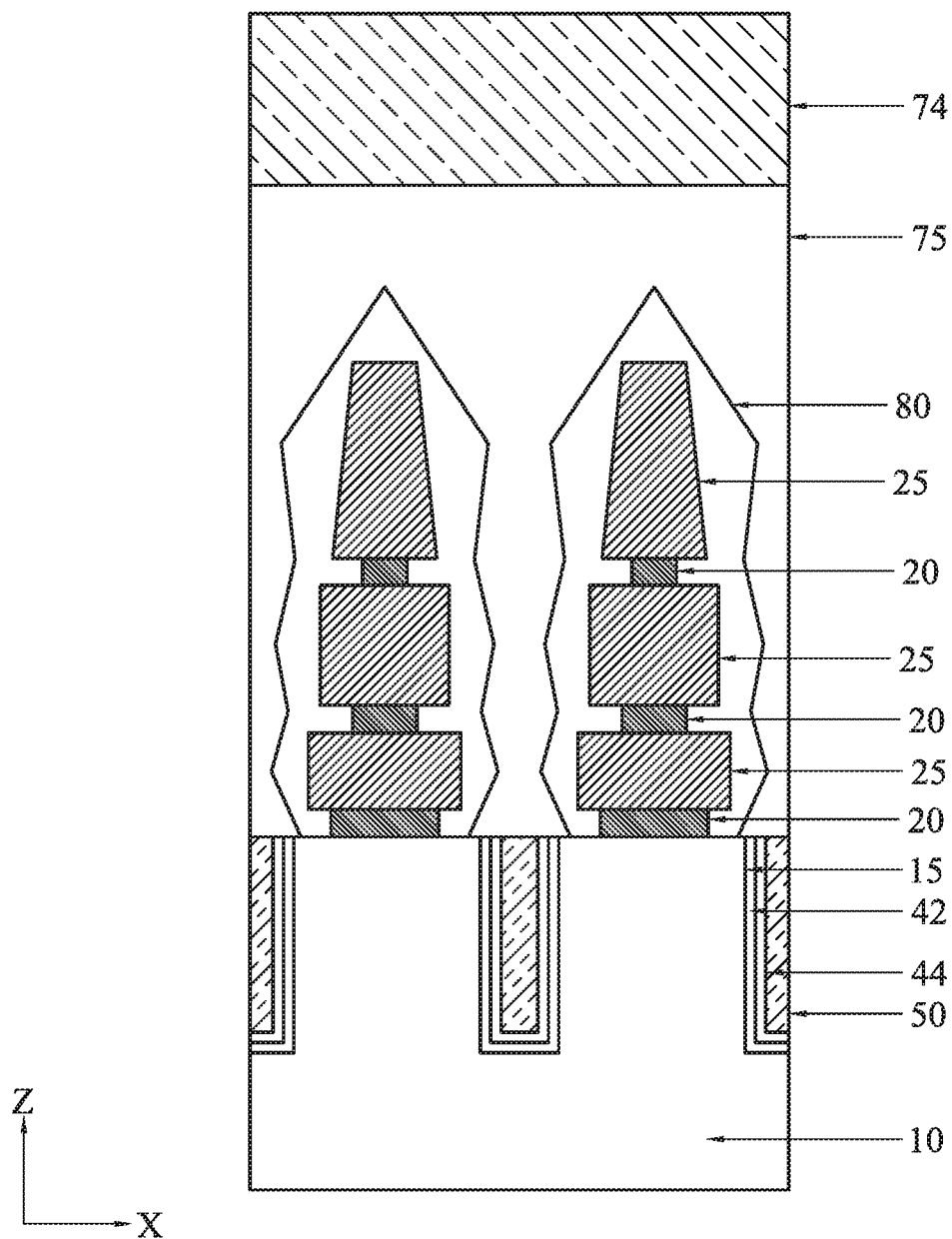
Figure 14:
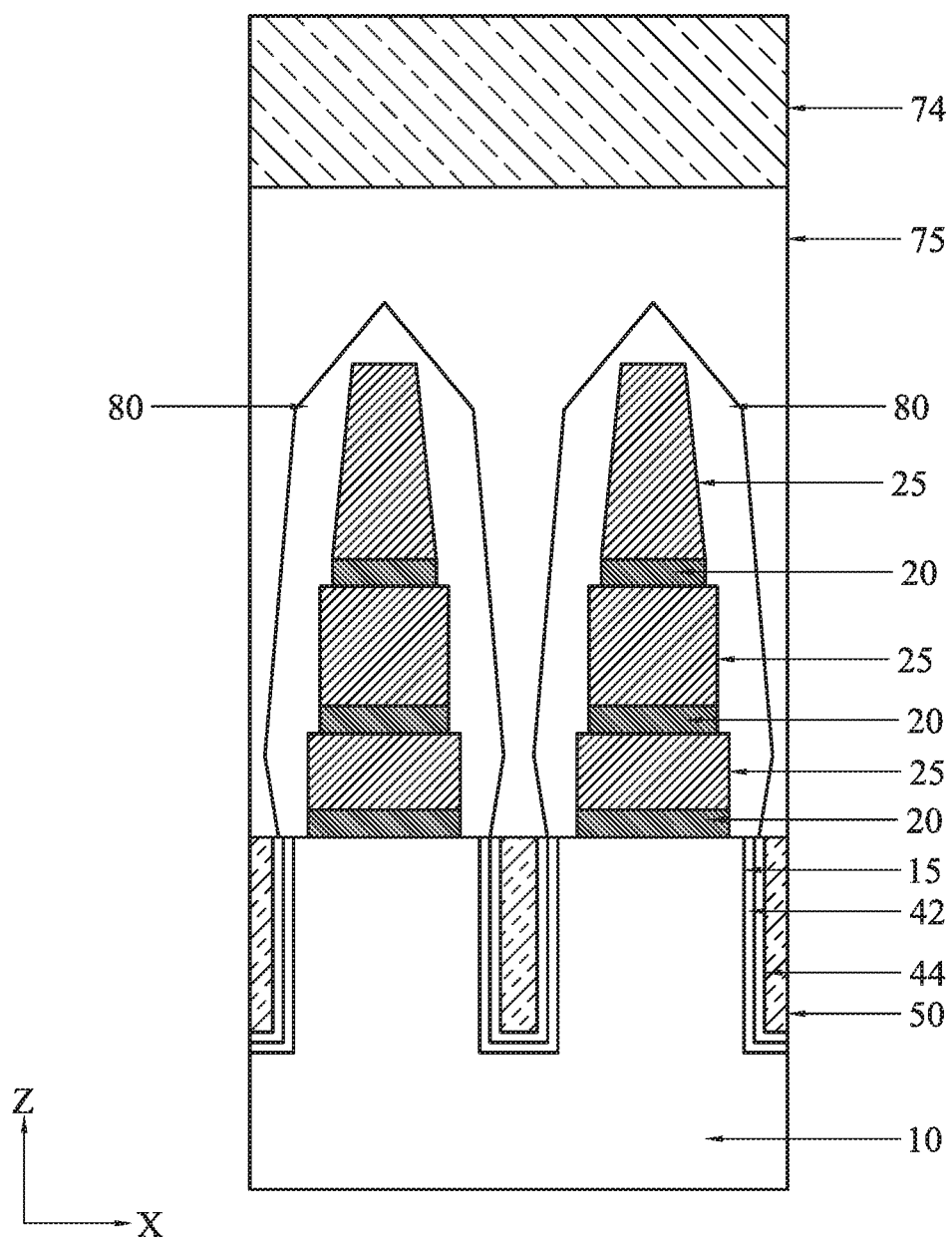

FIGS. 13 and 14, cross sections corresponding to line C-C of FIG. 1, show views of source/drain regions 80 in alternative embodiments of the present disclosure. In FIG. 12, the first semiconductor layers are fully removed at the manufacturing stage of FIG. 9. The S/D layer 80 is formed fully around the second semiconductor layers 25, and the surface area of the S/D layer 80 can be maximized. In FIG. 13, the first semiconductor layers 20 are partially etched at the manufacturing stage of FIG. 9. In this case, stress applied by the remaining first semiconductor layers 20 to the second semiconductor layers 25 is maintained, while a relatively larger surface area of the S/D layer 80 can be obtained. In FIG. 14, the first semiconductor layers 20 underlying the second semiconductor layers 25 are not etched at the manufacturing stage of FIG. 9. In this case, stress applied by the remaining first semiconductor layers 20 to the second semiconductor layers 25 can be maximized. Isotropic etching is used to remove the first semiconductor layers 20 in FIGS. 9 and 13, whereas anisotropic etching is used to form the structure in FIG. 14.

Figure 15:
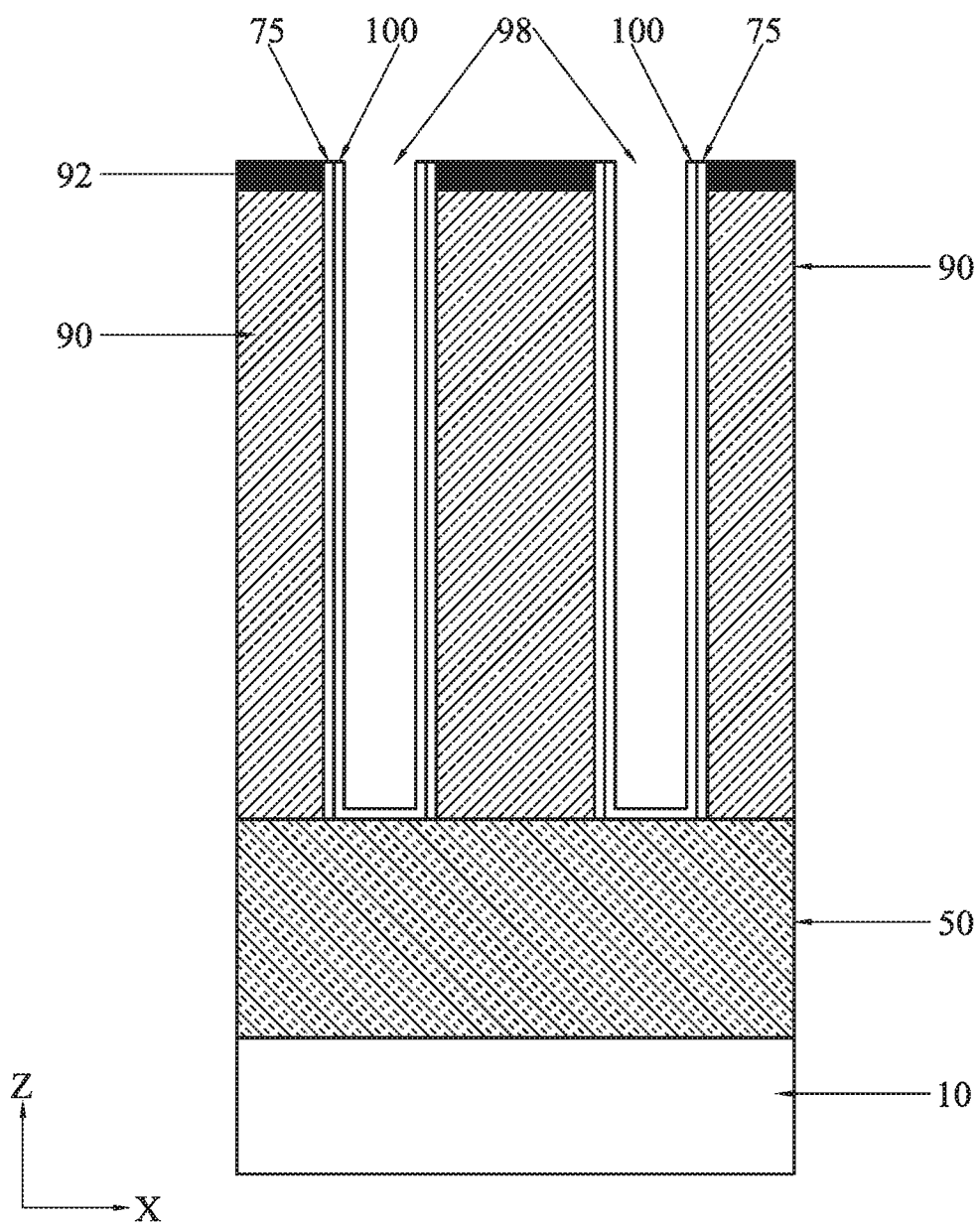

After the S/D layers are formed, an interlayer dielectric layer (ILD) 90 is formed over the entire structures and then the upper portion of the interlayer dielectric layer 90 is planarized by a CMP operation so that the upper surface of the sacrificial gate electrode layers 70 are exposed, the sacrificial gate electrodes 70 and sacrificial gate dielectric layers are removed forming a gate space 98 thereby exposing the nanowire structures 180, which subsequently become channel layers of the FETs, and a gate dielectric layer 100 is formed in the gate space 98, as shown in FIG. 15. FIG. 15 is a cross-sectional view corresponding to line D-D of FIG. 1.

The materials for the ILD layer 90 include compounds comprising Si, O, C and/or H, such as SiCOH and SiOC. Organic material, such as polymers, may be used for the ILD layer 90. Further, in some embodiments, before forming the ILD layer 90, a silicon oxide layer and silicon nitride layer are formed over the structure before forming the ILD layer 90. A SiN hard mask layer 92 may also be formed over the ILD layer 90.

The ILD layer 50 protects the S/D structures 80 during the removal of the sacrificial gate structures 170. The sacrificial gate structures 170 can be removed using plasma dry etching and/or wet etching. When the sacrificial gate electrode 70 is polysilicon and the ILD layer 90 is silicon oxide, a wet etchant such as a TMAH solution can be used to selectively remove the sacrificial gate electrodes 70. The sacrificial gate dielectric layer is thereafter removed using plasma dry etching and/or wet etching.

Figure 16:
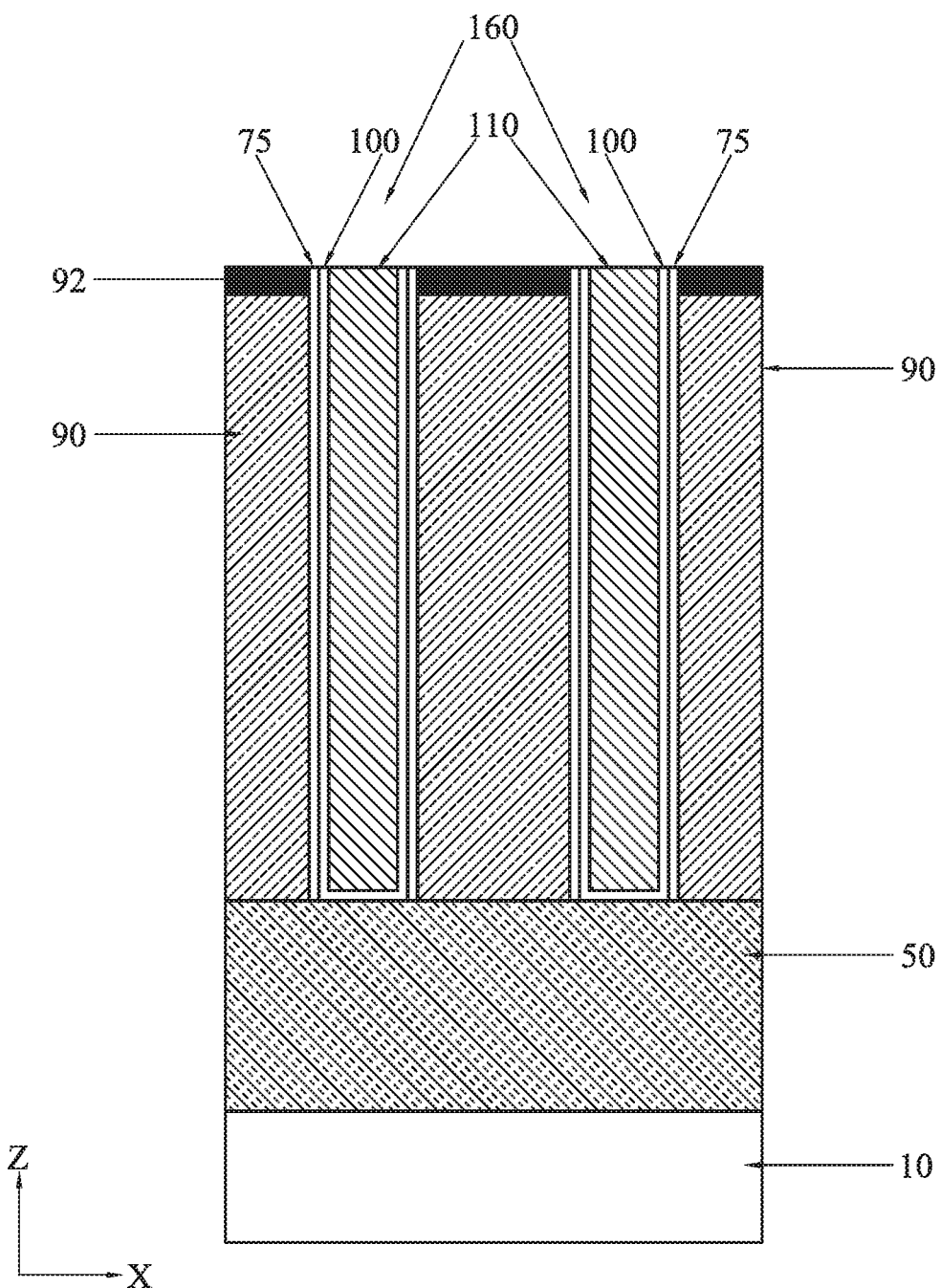
Figure 17:
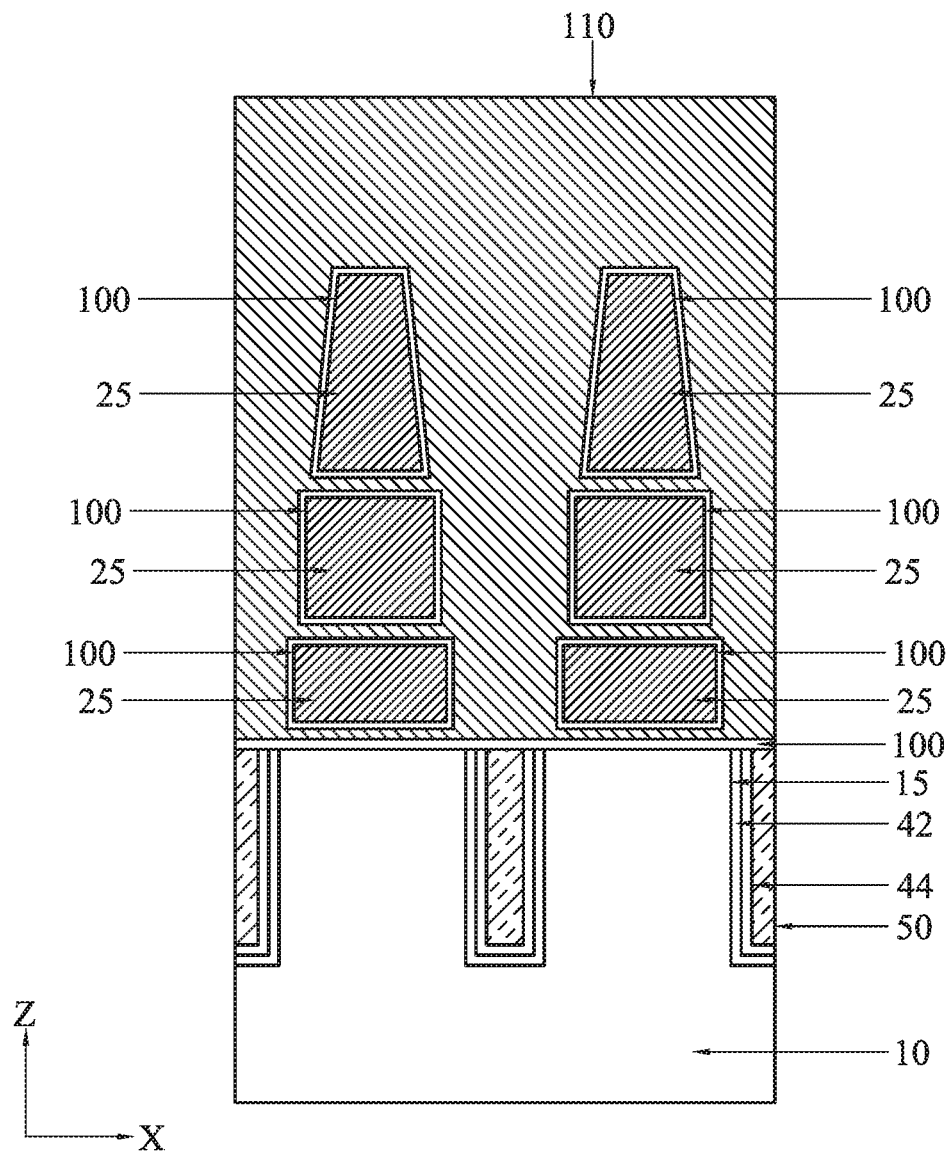

After the gate dielectric layer 100 is formed around each channel layers (second semiconductor layers 25), a gate electrode layer 110 is formed on the gate dielectric layer 100, as shown in FIGS. 16 and 17. FIG. 16 is a cross-sectional view corresponding to line D-D of FIG. 1 and FIG. 17 is a cross-sectional view corresponding to line B-B of FIG. 1.

In certain embodiments, the gate dielectric layer 100 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 100 includes an interfacial layer (not shown) formed between the channel layers and the dielectric material.

The gate dielectric layer 100 may be formed by CVD, ALD, or any suitable method. In one embodiment, the gate dielectric layer 100 is formed using a highly conformal deposition process such as ALD in order to ensure the formation of a gate dielectric layer having a uniform thickness around each channel layers. The thickness of the gate dielectric layer 100 is in a range from about 1 nm to about 6 nm in one embodiment.

The gate electrode layer 110 is formed on the gate dielectric layer 100 to surround each channel layer. The gate electrode layer 110 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 110 may be formed from CVD, ALD, electroplating, or other suitable method. The gate electrode layer is also deposited over the upper surface of the ILD layer 90. The gate dielectric layer and the gate electrode layer formed over the ILD layer 90 is then planarized by using, for example, CMP, until the top surface of the ILD layer 90 is revealed to form the gate electrode structure 160.

In certain embodiments of the present disclosure, one or more work function adjustment layers (not shown) are interposed between the gate dielectric layer 100 and the gate electrode 110. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for an N-type FET and a p-type FET which may use different metal layers.

Figure 18:
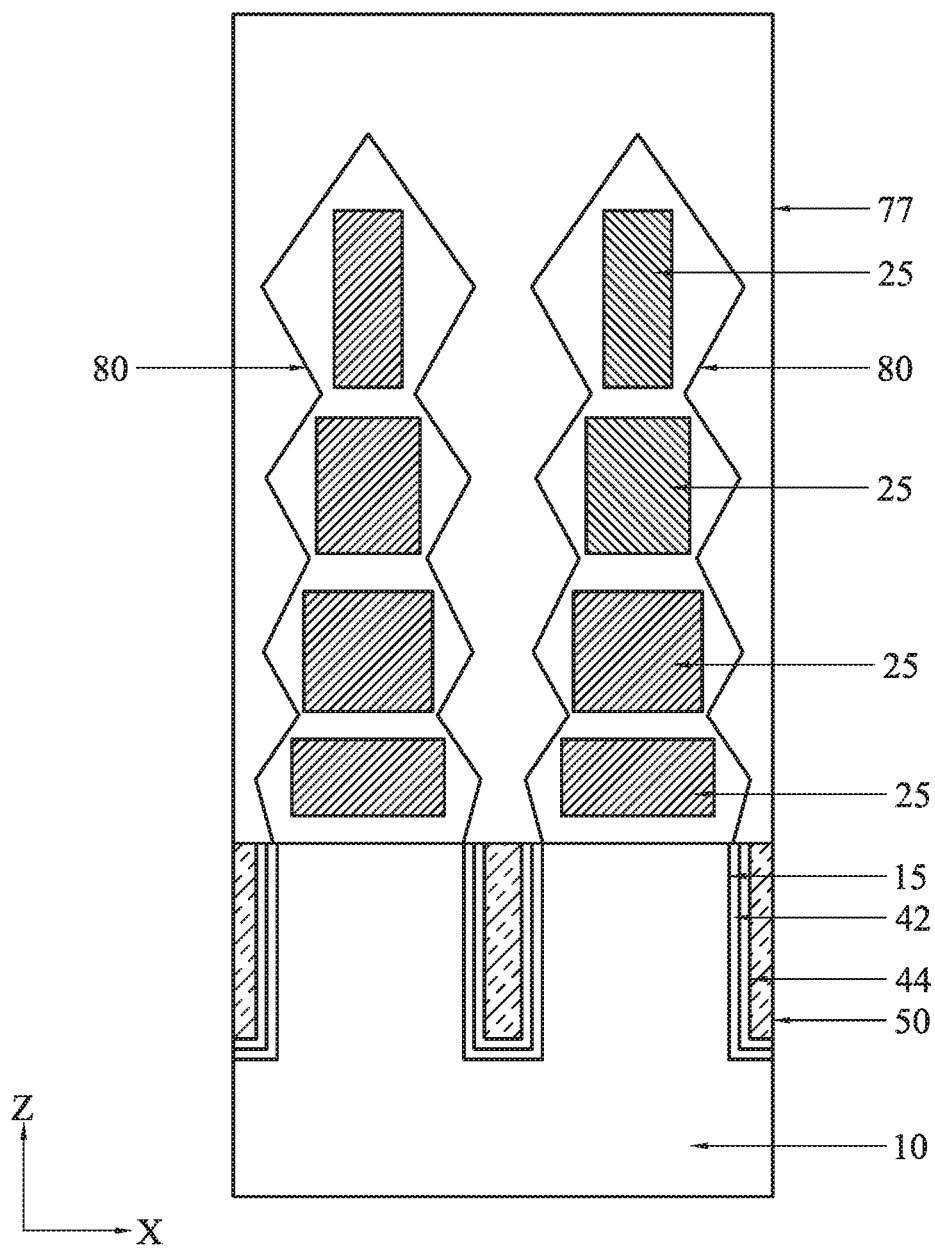
FIG. 18 shows an exemplary structure of the GAA FET device according to another embodiment of the present disclosure.

The present disclosure is not limited to fin structures comprising three stacked nanowires. In certain embodiments, additional nanowires may be included in each nanowire structure 180. For example, as shown in FIG. 18, a cross section view corresponding to line C-C of FIG. 1, four or more nanowires are included in nanowire structure 180. Further, it is not necessary that the uppermost nanowire be trapezoidal-shaped. As shown in FIG. 18, in certain embodiments the uppermost nanowire, or all the nanowires, are substantially rectangular-shaped. The length and widths of the nanowires are varied so that the cross-sectional area of each nanowire is substantially the same in certain embodiments.

Figure 19:
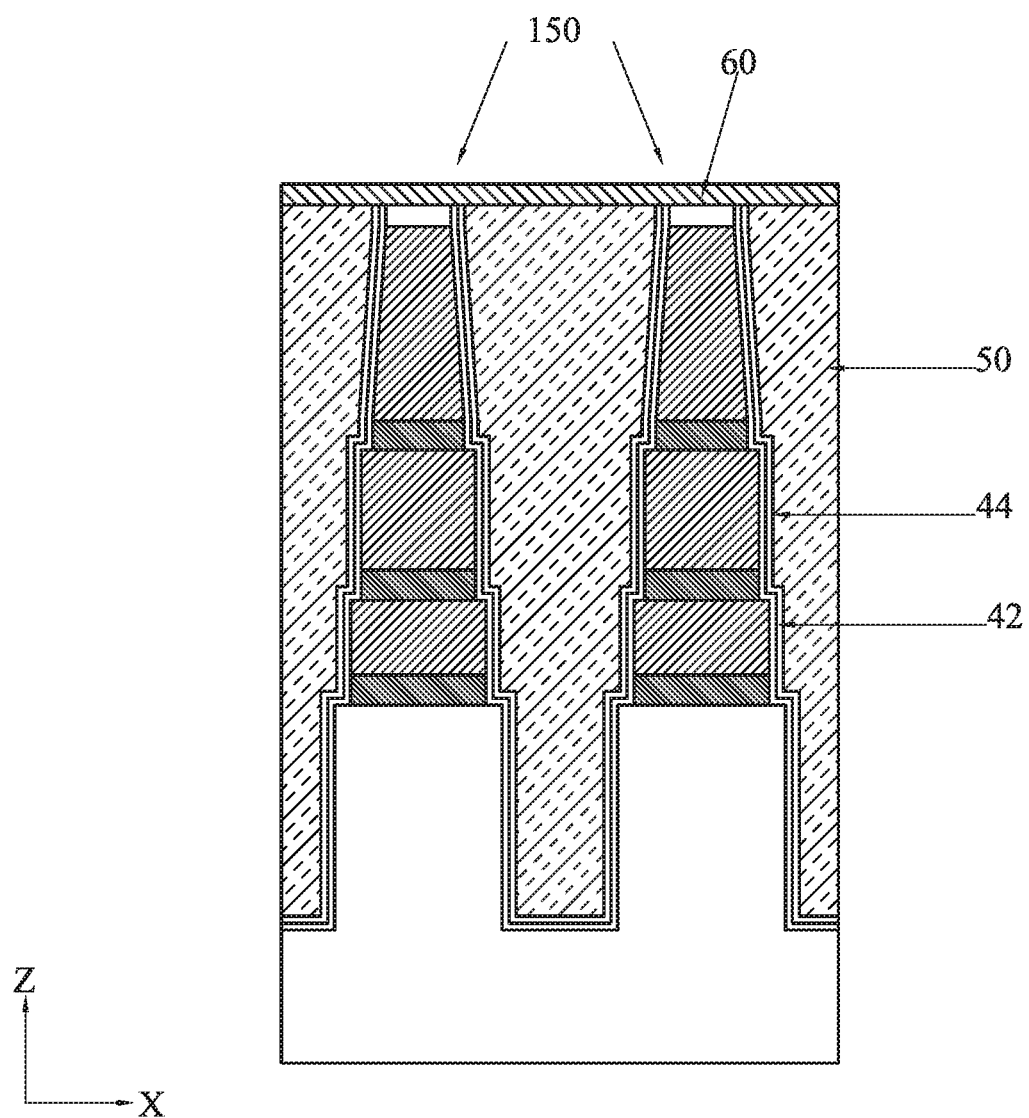
FIGS. 19-22 show exemplary sequential processes for manufacturing a GAA FET device according to another embodiment of the present disclosure.

In some embodiments of the present disclosure, a mask layer 60 is formed over the structure of FIG. 6, as shown in FIG. 19. The mask layer 60 is made of a silicon nitride-based material, such as SiN, SiON or SiCN, which has a higher etch selectivity against the isolation insulating layer 50.

Figure 20:
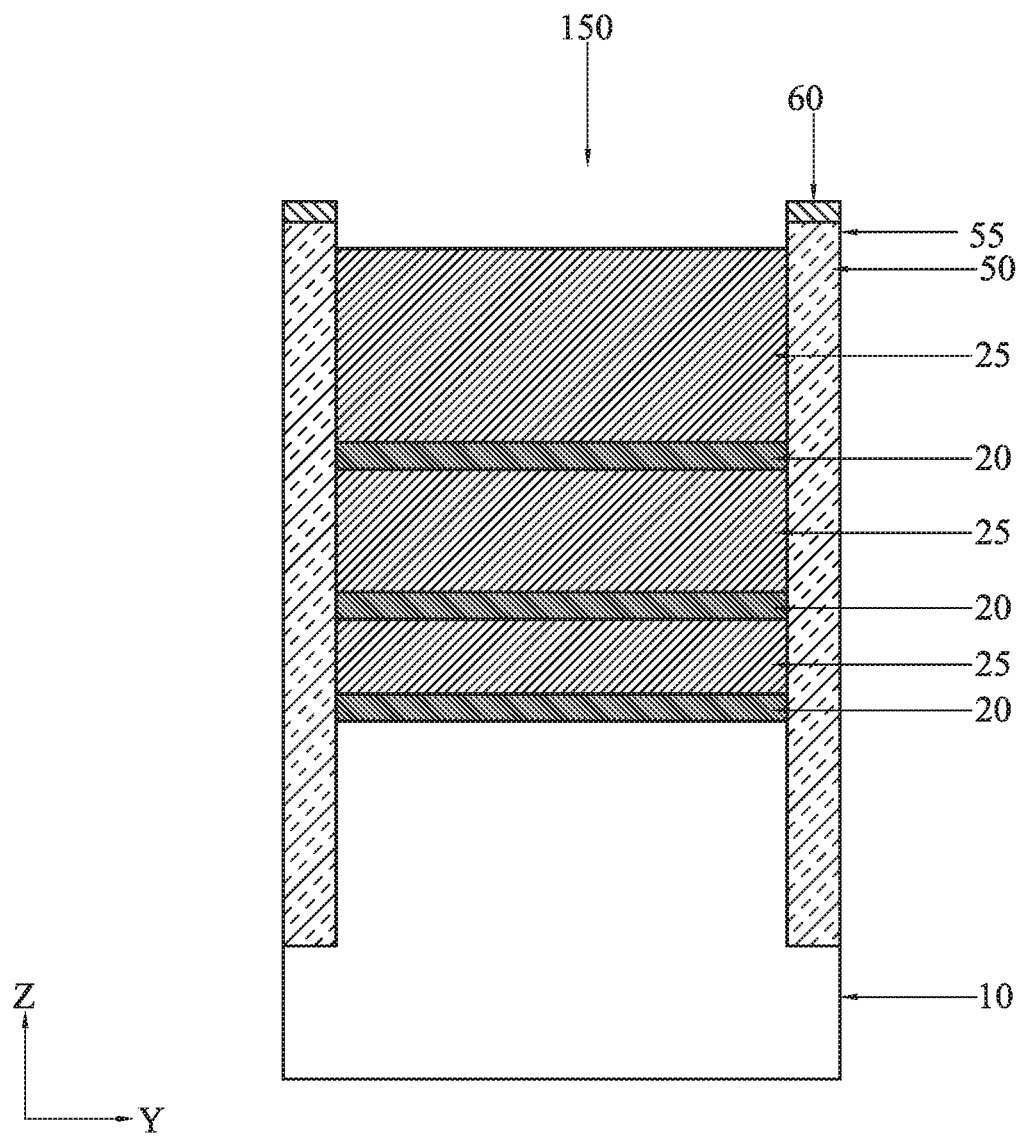

Subsequently, the mask layer 60 is patterned by using a lithography and an etching operation to make an opening and recess the isolation insulating layer 50 through the opening, to expose a part of the fin structures 150, as shown in FIG. 20, which is a cross section view corresponding to line A-A of FIG. 1. End portions of the fin structures 150 are buried in the isolation insulating layer, thereby forming an anchor structure 55 that anchors the second semiconductor layers 25 during subsequent processing.

Figure 21:
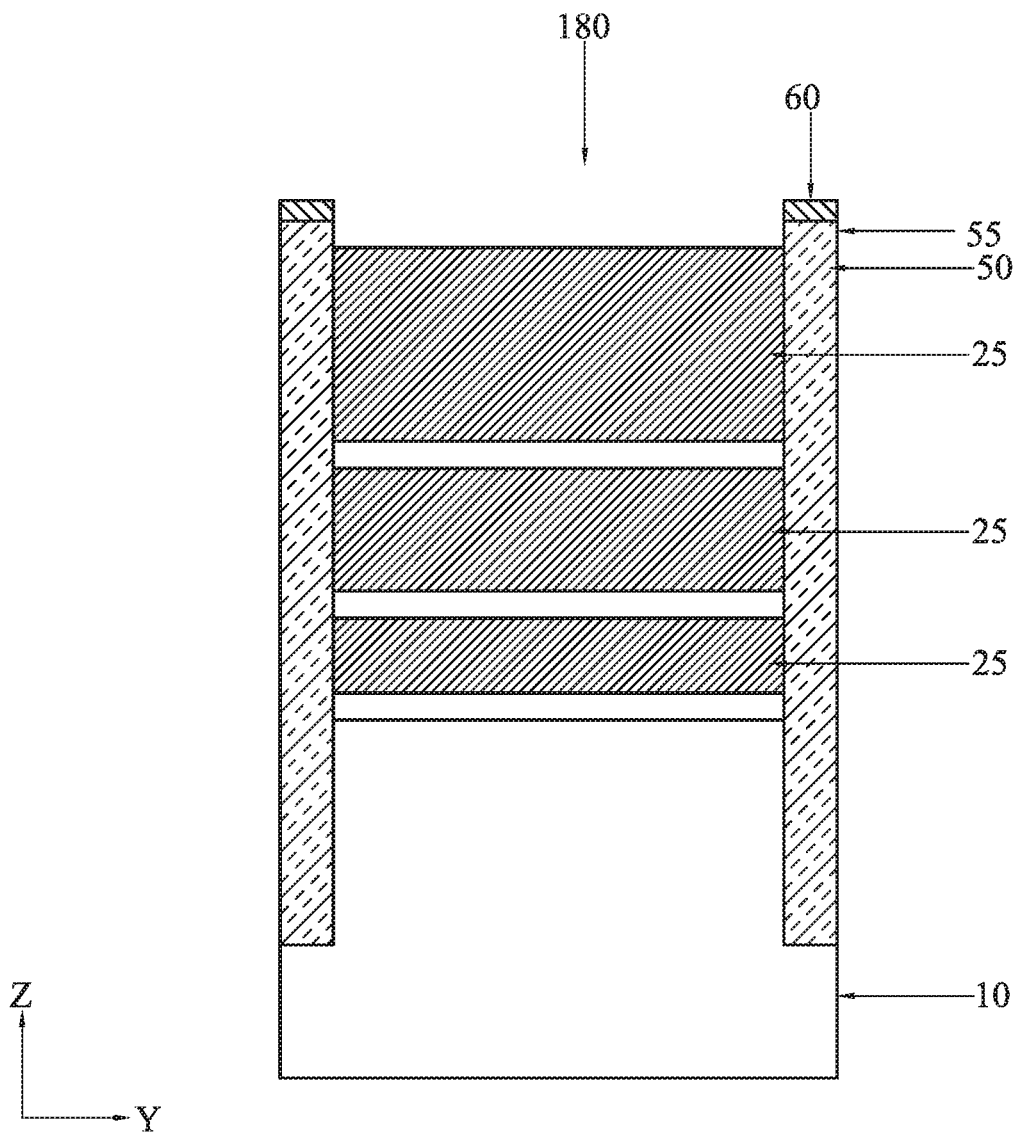

After the fin structures 150 are exposed from the isolation insulating layer 50, the first semiconductor layers 20 in the fin structure are removed, thereby forming a nanowire structure 180 including a plurality of nanowires of the second semiconductor layers 25 arranged in the Z direction, as shown in FIG. 21. In certain embodiments, each of the nanowires have substantially the same cross-sectional area when viewed in cross section. The anchor structures 55 are formed at the ends of the fin structures 150 so the nanowires of the second semiconductor layers 25 can be supported by the anchor structures when the first semiconductor layers 20 in the fin structures 150 are removed in this stage of the manufacturing process. By using the anchor structures, it is possible to make channel layers (e.g., wires) before forming source/drain layers.

Figure 22:
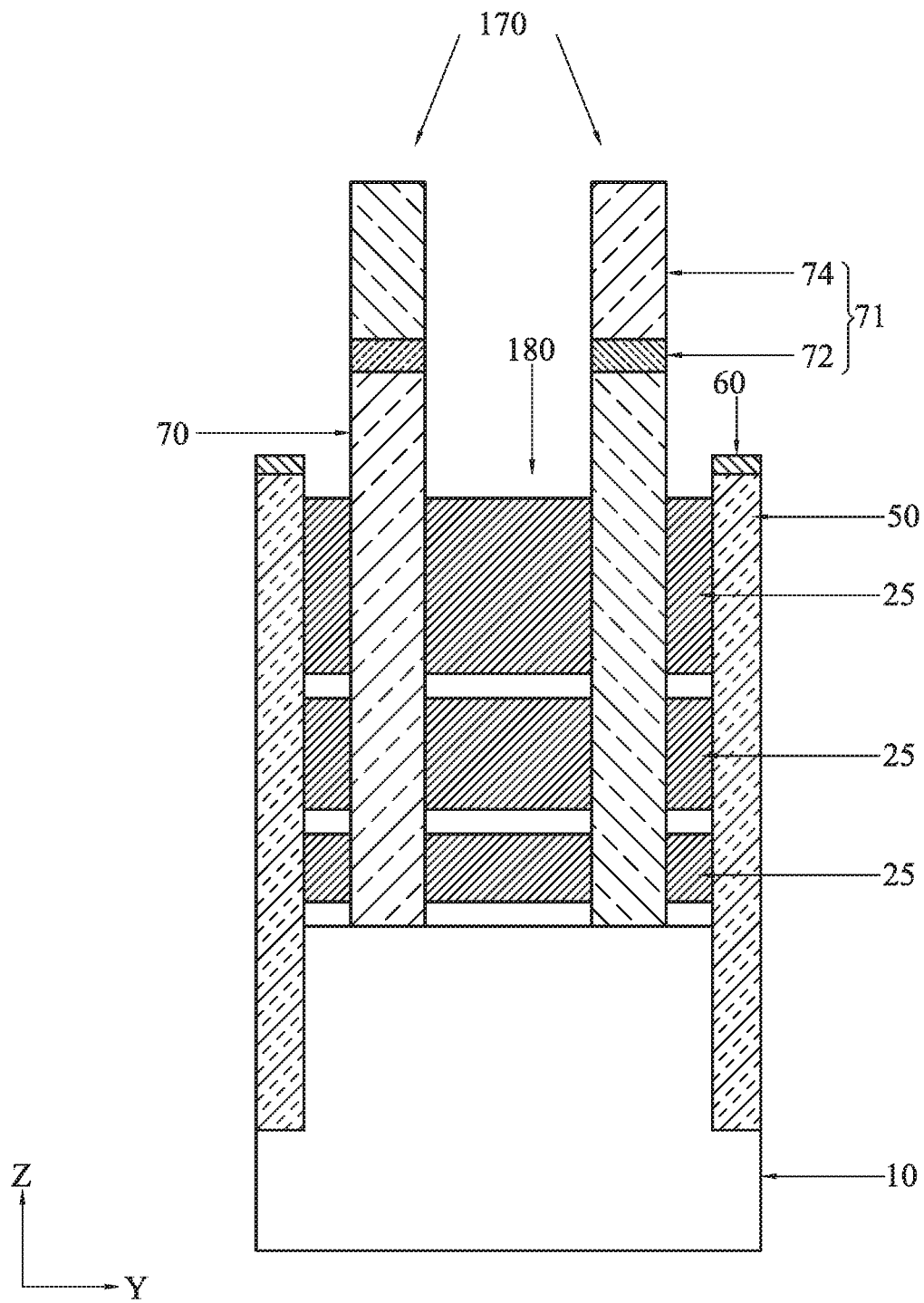

As shown in FIG. 22, sacrificial gate structures 170 are subsequently formed over the nanowire structure 180, in the same manner as sacrificial gate structures in FIG. 8. The sacrificial gate structures 170 includes a sacrificial gate electrode 70 and a sacrificial gate dielectric layer (not shown). The structure of FIG. 22 is subsequently processed in a similar manner as described in FIGS. 10-17 to form a semiconductor device.

It is understood that the GAA FETs undergo further CMOS processes to form various features such as contacts/vias, interconnect metal layers, dielectric layers, passivation layers, etc.

Figure 23:
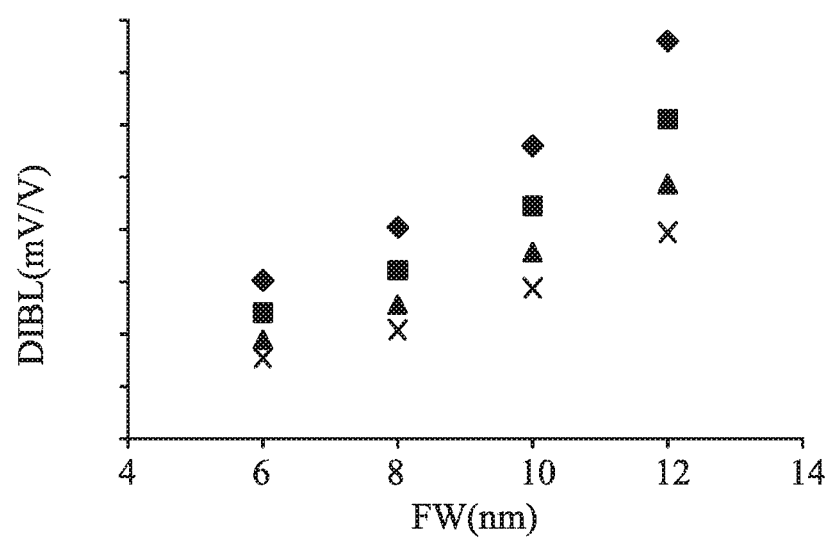
FIG. 23 is a graph showing the relationship between drain induced barrier lowering (DIBL) and fin widths of embodiments of the present disclosure.

The various embodiments or examples described herein offer several advantages over the existing art. In the GAA FET, a source/drain layer is fully or partially epitaxially grown on etched Si or SiGe stacked layers, which enhances surface area for contact landing. In the present disclosure improved performance is achieved by providing nanowires having substantially equal cross-sectional area within a fin structure. GAA FET devices according to the present disclosure provide improved short channel effect control. Further, as illustrated in FIG. 23, GAA FETs according to the present disclosure provide a substantially constant drain induced barrier lowering (DIBL) for each nanowire in a vertical arrangement along the Z direction. FIG. 23 shows the relative DIBL for a four nanowire arrangement, such as illustrated in FIG. 18 as the width of the nanowire increases in the X-direction. The diamond shape denotes the uppermost nanowire, the X shape denotes the lowermost nanowire, the triangle shape denotes the nanowire adjacent the lowermost nanowire, and the square shape denotes nanowire adjacent the uppermost nanowire. As shown in FIG. 18, the width of nanowires in the X direction decreases along the Z direction. As shown in FIG. 23, when the nanowires are arranged according to the present disclosure having decreasing widths along the Z-direction, while maintaining a substantially same area in cross section, the DIBL for each nanowire is substantially constant. On the other hand, if the width of each nanowire were the same, there would be a substantially greater variation in DIBL for each nanowire in a vertical arrangement of nanowires.

It will be understood that not all advantages have been necessarily discussed herein, no particular advantage is required for all embodiments or examples, and other embodiments or examples may offer different advantages.

An embodiment of the present disclosure is a semiconductor device, including at least one nanowire structure disposed on a semiconductor substrate and extending in a first direction on the semiconductor substrate. Each nanowire structure comprises a plurality of nanowires extending along the first direction and arranged in a second direction, the second direction being substantially perpendicular to the first direction. Each nanowire is spaced-apart from an immediately adjacent nanowire. A gate structure extends in a third direction over a first region of the nanowire structure, the third direction being substantially perpendicular to both the first direction and the second direction. The gate structure includes a gate electrode. Source/drain regions are disposed over a second region of the nanowire structure, the second region of the nanowire structure being located on opposing sides of the gate structure. The gate electrode wraps around each of the nanowires. When viewed in a cross section taken along the third direction each nanowire in the nanowire structure is differently shaped from other nanowires in the nanowire structure, and each nanowire in the nanowire structure has a substantially same cross-sectional area as other nanowires in the nanowire structure.

Another embodiment of the present disclosure is a semiconductor device, including at least one nanowire structure disposed on a semiconductor substrate and extending in a first direction on the semiconductor substrate. Each nanowire structure includes a plurality of nanowires extending along the first direction and arranged in a second direction, the second direction being substantially perpendicular to the first direction. Each nanowire is spaced-apart from other adjacent nanowires. A gate structure extends in a third direction over a first region of the nanowire structure, the third direction being substantially perpendicular to both the first direction and the second direction. The gate structure includes a gate electrode. Source/drain regions are disposed over a second region of the nanowire structure, the second region of the nanowire structure being located on opposing sides of the gate structure. The gate electrode wraps around each of the nanowires. When viewed in a cross section taken along the second direction a first nanowire located further from the substrate than an adjacent second nanowire has a longer length extending in the third direction than the second nanowire, and the first nanowire has a shorter width extending in the second direction than the second nanowire.

Another embodiment of the present disclosure is method of manufacturing a semiconductor device. The method includes forming a stacked structure of first semiconductor layers and second semiconductor layers alternately stacked in second direction over a substrate. The stacked structure is patterned into a fin structure extending along a first direction substantially perpendicular to the second direction. A portion of the first semiconductor layers is removed between adjacent second semiconductor layers to form a nanowire structure. A gate structure is formed extending in a third direction over a first portion of the nanowire structure so that the gate structure wraps around the second semiconductor layers. The third direction is substantially perpendicular to both the first direction and the second direction. Source/drain regions are formed over a second portion of the nanowire structure located on opposing sides of the nanowire structure so that the source/drain regions wrap around the second semiconductor layers. A thickness of a second semiconductor layer furthest from the substrate extending in the second direction is greater than other second semiconductor layers in the nanowire structure, and a thickness of a second semiconductor layer closest to the substrate extending in the second direction is smaller than other second semiconductor layers in the nanowire structure.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a stacked structure of first semiconductor layers and second semiconductor layers alternately stacked in a second direction over a substrate;
    patterning the stacked structure into a fin structure extending along a first direction substantially perpendicular to the second direction;
    removing a portion of the first semiconductor layers between adjacent second semiconductor layers to form a nanowire structure;
    forming a gate structure extending in a third direction over a first portion of the nanowire structure so that the gate structure wraps around the second semiconductor layers, the third direction being substantially perpendicular to both the first direction and the second direction;
    forming source/drain regions over a second portion of the nanowire structure located on opposing sides of the nanowire structure so that the source/drain regions wrap around the second semiconductor layers,
    wherein a thickness of a second semiconductor layer furthest from the substrate extending in the second direction is greater than other second semiconductor layers in the nanowire structure, and a thickness of a second semiconductor layer closest to the substrate extending in the second direction is smaller than other second semiconductor layers in the nanowire structure.

2. The method according to claim 1, wherein a width in the third direction of a second semiconductor layer furthest from the substrate is less than other second semiconductor layers in the nanowire structure, and a width in the third direction of a second semiconductor layer closest to the substrate is greater than other second semiconductor layers in the nanowire structure.

3. The method according to claim 1, wherein the patterning the stacked structure into a fin structure comprises:
    isotropically etching a second semiconductor layer furthest from the substrate; and
    anisotropically etching another second semiconductor layer closer to the substrate.

4. The method according to claim 1, further comprising:
    forming an isolation insulating layer over the fin structure;
    forming a cover layer over the isolation insulating layer;
    patterning the cover layer so as to form an opening and remaining boundary portions; and
    recessing the isolation insulating layer through the opening to expose a central region of the fin structure, so that end regions of the fin structure remain buried in the isolation insulating layer, and
    wherein the portion of the first semiconductor layers removed between adjacent first semiconductor layers is in the central region.

5. The method according to claim 1, wherein the forming the gate structure comprises:
    forming a conformal gate dielectric layer wrapping around the second semiconductor layers; and
    forming a gate electrode layer on the gate dielectric layer wrapping around the second semiconductor layers.

6. The method according to claim 1, wherein the portion of the first semiconductor layers removed between adjacent second semiconductor layers is removed by isotropically etching the first semiconductor layers between adjacent second semiconductor layers.

7. The method according to claim 1, wherein the first semiconductor layers are formed to a substantially same thickness in the second direction.

8. A method of manufacturing a semiconductor device, comprising:
    forming a stacked structure of first semiconductor layers and second semiconductor layers alternately stacked in a second direction over a substrate;
    patterning the stacked structure into a fin structure extending along a first direction substantially perpendicular to the second direction;
    removing a first portion of the first semiconductor layers between adjacent second semiconductor layers so that a second portion of the first semiconductor layers remains between adjacent second semiconductor layers to form a nanowire structure;
    forming a gate structure extending in a third direction over a first portion of the nanowire structure so that the gate structure wraps around the second semiconductor layers, the third direction being substantially perpendicular to both the first direction and the second direction,
    wherein a width of a second portion of the first semiconductor layer furthest from the substrate extending in the third direction is less than other second portions of the first semiconductor layers in the nanowire structure, and a width of a second portion of the first semiconductor layer closest to the substrate extending in the third is greater than other second portions of the first semiconductor layer in the nanowire structure.

9. The method according to claim 8, wherein the forming the gate structure comprises:
    forming a conformal gate dielectric layer wrapping around the second semiconductor layers; and
    forming a gate electrode layer on the gate dielectric layer wrapping around the second semiconductor layers.

10. The method according to claim 8, wherein a width in the third direction of second portion of any first semiconductor layer is less than a width in the third direction of any immediately adjacent second semiconductor layer.

11. The method according to claim 8, wherein the patterning the stacked structure into a tin structure comprises:
    isotropically etching a second semiconductor layer furthest from the substrate; and
    anisotropically etching another second semiconductor layer closer to the substrate.

12. The method according to claim 8, further comprising:
forming an isolation insulating layer over the fin structure;
forming a cover layer over the isolation insulating layer;
patterning the cover layer so as to form an opening and remaining boundary portions; and
recessing the isolation insulating layer through the opening to expose a central region of the fin structure, so that end regions of the fin structure remain buried in the isolation insulating layer, and
wherein the portion of the first semiconductor layers removed between adjacent first semiconductor layers is in the central region.

13. The method according to claim 1, wherein the first portion of the first semiconductor layers removed between adjacent second semiconductor layers is removed by isotropically etching the first semiconductor layers between adjacent second semiconductor layers.

14. The method according to claim 1, wherein the first semiconductor layers are formed to a substantially same thickness in the second direction.

15. A method of manufacturing a semiconductor device, comprising:
forming a stacked structure of first semiconductor layers and second semiconductor layers alternately stacked in a second direction over a substrate;
patterning the stacked structure into a fin structure extending along a first direction substantially perpendicular to the second direction, wherein the patterning includes:
isotropic etching of an uppermost second semiconductor layer, anisotropic etching of lower second semiconductor layers, and isotropic etching of the first semiconductor layers to form a nanowire structure; and
forming a gate structure extending in a third direction over a first portion of the nanowire structure so that the gate structure wraps around the second semiconductor layers, the third direction being substantially perpendicular to both the first direction and the second direction,
wherein the second semiconductor layer located furthest from the substrate is substantially trapezoidal-shaped when viewed in a cross section, and
the second semiconductor layer located closest to the substrate is substantially rectangular-shaped when viewed in the cross section.

16. The method according to claim 15, further comprising forming source/drain regions over a second portion of the nanowire structure, the second portion of the nanowire structure being located on opposing sides of the gate structure.

17. The method according to claim 16, wherein the gate structure is a sacrificial gate structure, and further comprising after forming the source/drain regions:
removing the sacrificial gate structure to form a gate space; and
forming a high-k gate dielectric layer and a metal gate electrode layer in the gate space.

18. The method according to claim 17, wherein the high-k gate dielectric layer and the metal gate electrode layer wraps around the second semiconductor layers.

19. The method according to claim 15, further comprising:
forming an isolation insulating layer over the fin structure;
forming a cover layer over the isolation insulating layer;
patterning the cover layer so as to form an opening and remaining boundary portions; and
recessing the isolation insulating layer through the opening to expose a central region of the fin structure, so that end regions of the fin structure remain buried in the isolation insulating layer, and
wherein the portion of the first semiconductor layers removed between adjacent first semiconductor layers is in the central region.

20. The method according to claim 15, wherein the first semiconductor layers are formed to a substantially same thickness in the second direction.

* * * * *